US012747258B2

(12) United States Patent
Park et al.

(10) Patent No.: US 12,747,258 B2
(45) Date of Patent: Sep. 29, 2026

(54) METAL OXIDE THIN FILM PRECURSOR, METHOD OF FABRICATING METAL OXIDE THIN FILM USING THE SAME, AND SEMICONDUCTOR DEVICE INCLUDING THE METAL OXIDE THIN FILM

(71) Applicant: UNIVERSITY-INDUSTRY COOPERATION GROUP OF KYUNG HEE UNIVERSITY, Yongin-si (KR)

(72) Inventors: Jongwook Park, Seoul (KR); Woojin Jeon, Yongin-si (KR); Sunwoo Park, Gwangju-si (KR); Hayoon Lee, Incheon (KR); Sang Wook Park, Paju-si (KR); Yoona Choi, Seoul (KR)

(73) Assignee: UNIVERSITY-INDUSTRY COOPERATION GROUP OF KYUNG HEE UNIVERSITY, Yongin-si (KR)

( * ) Notice: Subject to any disclaimer, the term of this patent is extended or adjusted under 35 U.S.C. 154(b) by 597 days.

(21) Appl. No.: 18/212,376

(22) Filed: Jun. 21, 2023

(65) Prior Publication Data

US 2024/0199670 A1 Jun. 20, 2024

(30) Foreign Application Priority Data

Dec. 1, 2022 (KR) ........................ 10-2022-0165800

(51) Int. Cl.

| | |
|---|---|
| ***C07F 17/00*** | (2006.01) |
| ***C01G 25/02*** | (2006.01) |
| ***C01G 27/02*** | (2006.01) |
| ***C07B 59/00*** | (2006.01) |
| ***C23C 16/40*** | (2006.01) |
| ***C23C 16/455*** | (2006.01) |
| ***H10P 14/60*** | (2026.01) |
| ***H10P 14/692*** | (2026.01) |

(52) U.S. Cl.

CPC .............. *C07F 17/00* (2013.01); *C01G 25/02* (2013.01); *C01G 27/02* (2013.01); *C07B 59/00* (2013.01); *C23C 16/405* (2013.01); *C23C 16/45529* (2013.01); *C23C 16/45553* (2013.01); *H10P 14/668* (2026.01); *H10P 14/69392* (2026.01); *H10P 14/69395* (2026.01); *C01P 2002/72* (2013.01); *C01P 2002/88* (2013.01); *C01P 2006/40* (2013.01); *C07B 2200/05* (2013.01)

(58) Field of Classification Search

CPC ............................ C07F 17/00; C07B 2200/05

See application file for complete search history.

(56) References Cited

U.S. PATENT DOCUMENTS

| | | | | |
|---|---|---|---|---|
| 6,579,630 | B2 * | 6/2003 | Li | H10K 85/324 428/917 |
| 8,465,849 | B2 * | 6/2013 | Fennimore | C09K 11/06 428/917 |
| 8,946,096 | B2 | 2/2015 | Ahn et al. | |
| 9,082,611 | B2 * | 7/2015 | Chung | H10P 14/6687 |
| 10,217,629 | B2 | 2/2019 | Dussarrat et al. | |
| 2002/0076576 | A1 * | 6/2002 | Li | H10K 85/342 428/917 |
| 2009/0142881 | A1 * | 6/2009 | Xiao | C01B 19/002 438/102 |
| 2011/0207337 | A1 * | 8/2011 | Dussarrat | H10P 14/668 438/785 |
| 2014/0242812 | A1 * | 8/2014 | Dussarrat | H10P 14/668 438/785 |
| 2020/0395218 | A1 * | 12/2020 | Seutter | C23C 16/30 |
| 2022/0411446 | A1 * | 12/2022 | Jilek | G03F 7/325 |
| 2024/0239817 | A1 * | 7/2024 | Park | C01G 25/02 |

FOREIGN PATENT DOCUMENTS

| | | | | |
|---|---|---|---|---|
| JP | 2012201652 A | * | 10/2012 | |
| KR | 10-1993355 | | 9/2019 | |
| KR | 10-2020-0114741 | | 10/2020 | |
| KR | 20200114741 A | * | 10/2020 | H10D 64/01342 |

OTHER PUBLICATIONS

D. Kissounko et al., 126 Journal of the American Chemical Society, 1776-1783 (2007) (Year: 2007).*

W. Meier-Augenstein et al., Stable Isotope Analysis: General Principles and Limitations, In Wiley Encyclopedia of Forensic Science, 1-15 (2012) (Year: 2012).*

CAS Abstract and Indexed Compound from D. Kissounko et al., 126 Journal of the American Chemical Society, 1776-1783 (2007) (Year: 2007).*

J. Niinistö et al., 18 Journal of Materials Chemistry, 5243-5247 (2008) (Year: 2008).*

S. Kinnunen et al., 11 Coatings, 1-15 (2021) (Year: 2021).*

* cited by examiner

*Primary Examiner* — Alexander R Pagano

(74) *Attorney, Agent, or Firm* — LEX IP MEISTER, PLLC

(57) ABSTRACT

Disclosed are a metal oxide thin film precursor represented by Chemical Formula 1, a method of fabricating a metal oxide thin film using the same, and a semiconductor device including the metal oxide thin film.

[Chemical Formula 1]

(Continued)

The definition of Chemical Formula 1 is as described in the detailed description.

22 Claims, 11 Drawing Sheets

METAL OXIDE THIN FILM PRECURSOR, METHOD OF FABRICATING METAL OXIDE THIN FILM USING THE SAME, AND SEMICONDUCTOR DEVICE INCLUDING THE METAL OXIDE THIN FILM

CROSS-REFERENCE TO RELATED APPLICATION

This application claims priority to and the benefit of Korean Patent Application No. 10-2022-0165800 filed in the Korean Intellectual Property Office on Dec. 1, 2022, the entire contents of which are incorporated herein by reference.

BACKGROUND OF THE INVENTION

(a) Field of the Invention

The present invention relates to a metal oxide thin film precursor, a method of fabricating a metal oxide thin film using the same, and a semiconductor device including the metal oxide thin film.

(b) Description of the Related Art

In the big data industry, one of the most important industries of the 4th industrial revolution, as an amount of data to be processed is increased, and a demand for various electronic devices is increased, DRAM is being more necessary and important. In this regard, a market for DRAM has grown rapidly over the past few decades, and this growth has reached an unprecedented level in recent years. Since a capacitor mainly determines operating characteristics of a DRAM device, most of research on DRAM is focused on improving performance of DRAM capacitors. The DRAM capacitors have a MIM (Metal-Insulator-Metal) structure and require low leakage current density and high capacitance density for thorough operations (e.g.: reading, writing, and refreshing).

In order to solve this problem, research on high dielectric (high-k) materials with excellent insulation and a high dielectric constant is being actively conducted. Furthermore, as the semiconductor structure becomes more direct and refined, increasing is a demand for a precursor organometallic compound, which is a high dielectric material with high thermal stability and high volatility and is possibly liquid at room temperature, so that it may be applied to various processes (for example, an atomic layer deposition (ALD) method, a chemical vapor deposition (CVD) method, etc.) to secure excellent step coverage in fine patterns.

In order to increase capacitance of the DRAM capacitors, a dielectric layer with a high dielectric constant is required. A method of increasing a dielectric constant without changing a dielectric layer material is to increase crystallinity of the dielectric layer material. This crystallinity is improved by increasing a deposition temperature. However, in the atomic layer deposition method (ALD process) of depositing the dielectric layer, since an upper limit of a process window of a process temperature is determined by a thermal decomposition temperature of a precursor, it is the most important factor to secure thermal stability of the precursor. In other words, a precursor having high thermal stability may be used to increase the temperature of the atomic layer deposition method (ALD process) and thus improve crystallinity, resultantly improving a dielectric constant of a dielectric layer and thereby increasing capacitance thereof.

However, the current performance of the dielectric layer (metal oxide thin film) for a semiconductor device, which exhibits capacitance at a predetermined level as well as minimizes a leakage current, does not meet the needs of the market. Accordingly, the present inventors have used a precursor with thermal stability to increase crystallinity of a dielectric layer and thereby increase a dielectric constant of the dielectric layer, ultimately developing a semiconductor device having low leakage current density and high capacitance density, specifically, a DRAM capacitor.

SUMMARY OF THE INVENTION

An embodiment provides a metal oxide thin film precursor that is thermally stable and can be reliably used in a deposition process.

Another embodiment provides a method of forming a metal oxide thin film by depositing the metal oxide thin film precursor to obtain a uniformly formed metal oxide thin film with improved thin film properties, low thickness, and sufficient step covering.

Another embodiment provides a semiconductor device including a metal oxide thin film formed by the above method.

According to an embodiment, a metal oxide thin film precursor represented by Chemical Formula 1 is provided.

[Chemical Formula 1]

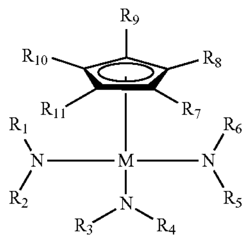

In Chemical Formula 1,

M is titanium (Ti), zirconium (Zr), or hafnium (Hf), $R^1$ to $R^6$ are each independently hydrogen, deuterium, a substituted or unsubstituted C1 to C6 alkyl group, a substituted or unsubstituted C2 to C6 alkenyl group, or a substituted or unsubstituted silyl group, $R^7$ to $R^{11}$ are each independently hydrogen, deuterium, a halogen element, a substituted or unsubstituted C1 to C6 alkyl group, a substituted or unsubstituted C2 to C6 alkenyl group, a substituted or unsubstituted C1 to C6 heteroalkyl group, or a substituted or unsubstituted silyl group, provided that at least one of $R^7$ to $R^{11}$ is necessarily deuterium or at least one of $R^1$ to $R^6$ necessarily includes deuterium, at least one of $R^1$ to $R^6$ are linked with at least one of $R^7$ to $R^{11}$ to form a fused ring, $R^1$ and $R^2$ may be linked with each other to form a fused ring, $R^3$ and $R^4$ may be linked with each other to form a fused ring, $R^5$ and $R^6$ may be linked with each other to form a fused ring, at least one of $R^1$ and $R^2$ and at least one of $R^3$ and $R^4$ may be linked with each other to form a fused ring, at least one of $R^3$ and $R^4$ and at least one of $R^5$ and $R^6$ may be linked with each other to form a fused ring, and at least one of $R^1$ and $R^2$ and at least one of $R^5$ and $R^6$ may be linked with each other to form a fused ring.

$R^1$ to $R^6$ may each independently be a substituted or unsubstituted C1 to C6 alkyl group.

At least two of $R^7$ to $R^{11}$ may necessarily be deuterium.

At least three of $R^7$ to $R^{11}$ may necessarily be deuterium.

At least four of $R^7$ to $R^{11}$ may necessarily be deuterium.

All of $R^7$ to $R^{11}$ may be deuterium.

At least one of $R^1$ to $R^6$ may be a C1 to C6 alkyl group substituted with deuterium.

$R^6$ and $R^8$ may be linked with each other to form a fused ring.

$R^3$ and $R^4$ may be linked with each other to form a fused ring.

$R^4$ and $R^5$ may be linked with each other to form a fused ring.

Chemical Formula 1 may be represented by Chemical Formula 2-1 or Chemical Formula 2-2.

[Chemical Formula 2-1]

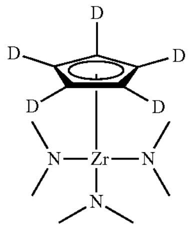

[Chemical Formula 2-2]

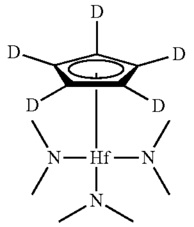

Chemical Formula 1 may be represented by any one of Chemical Formula 3-1 to Chemical Formula 3-18.

[Chemical Formula 3-1]

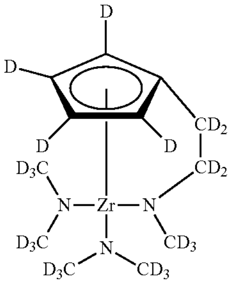

[Chemical Formula 3-2]

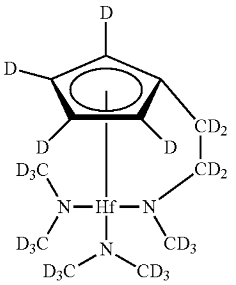

-continued

[Chemical Formula 3-3]

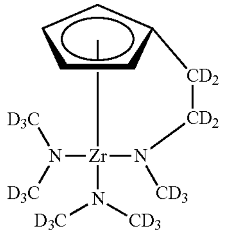

[Chemical Formula 3-4]

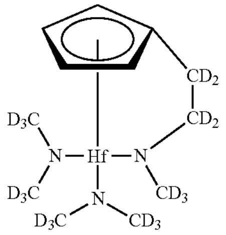

[Chemical Formula 3-5]

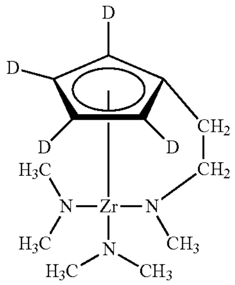

[Chemical Formula 3-6]

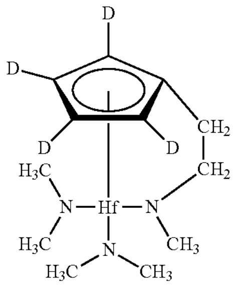

[Chemical Formula 3-7]

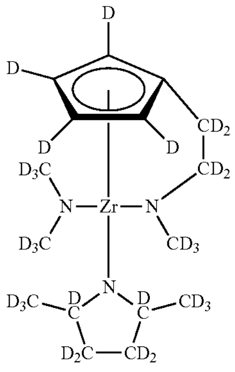

-continued
[Chemical Formula 3-8]
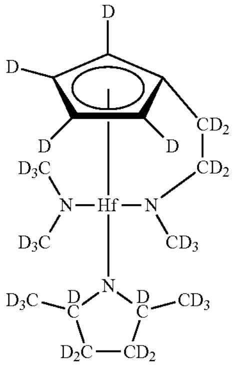
[Chemical Formula 3-9]
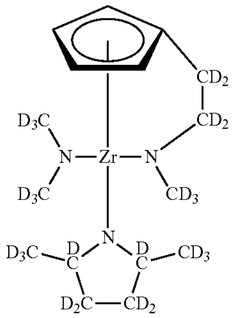
[Chemical Formula 3-10]
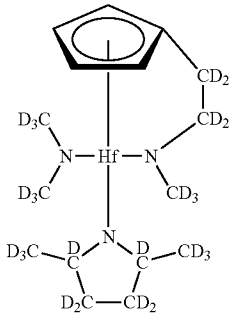
[Chemical Formula 3-11]
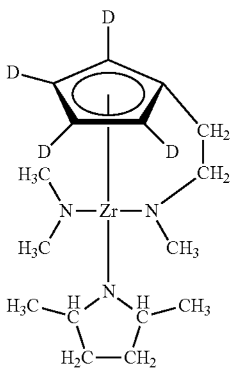
-continued
[Chemical Formula 3-12]
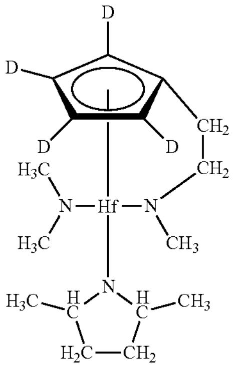
[Chemical Formula 3-13]
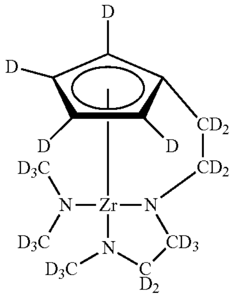
[Chemical Formula 3-14]
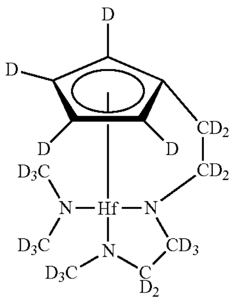
[Chemical Formula 3-15]
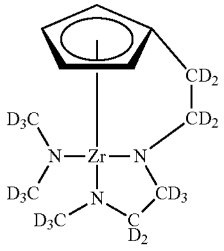
[Chemical Formula 3-16]
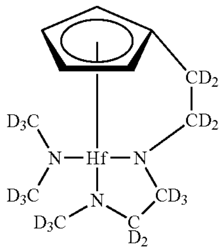

-continued
[Chemical Formula 3-17]
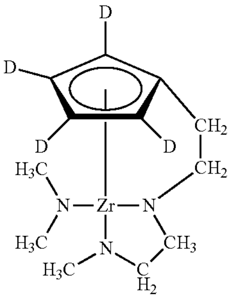
[Chemical Formula 3-18]
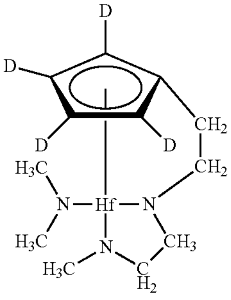
Chemical Formula 1 may be represented by any one of Chemical Formula 4-1 to Chemical Formula 4-24.
[Chemical Formula 4-1]
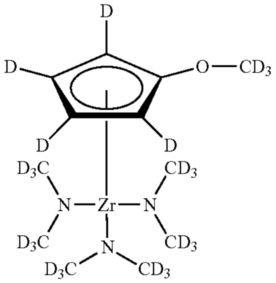
[Chemical Formula 4-2]
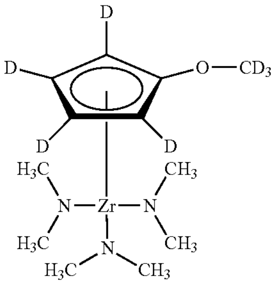
[Chemical Formula 4-3]
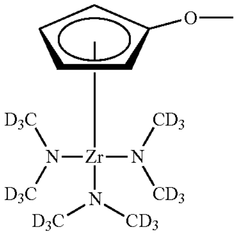
-continued
[Chemical Formula 4-4]
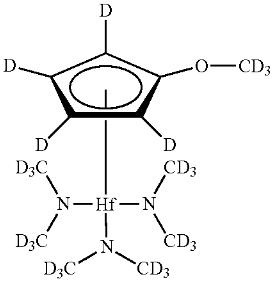
[Chemical Formula 4-5]
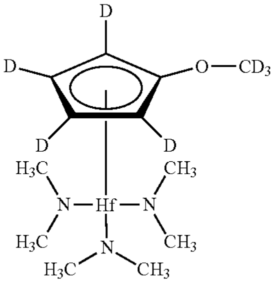
[Chemical Formula 4-6]
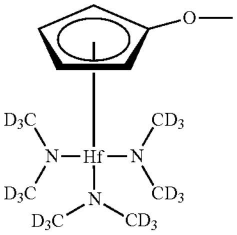
[Chemical Formula 4-7]
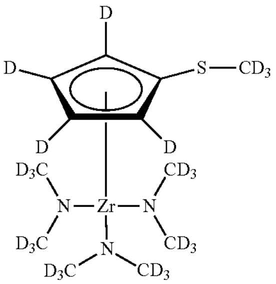
[Chemical Formula 4-8]
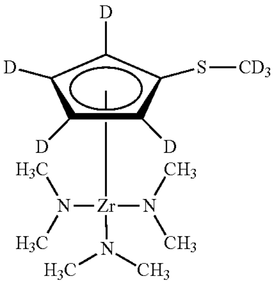

-continued
[Chemical Formula 4-9]
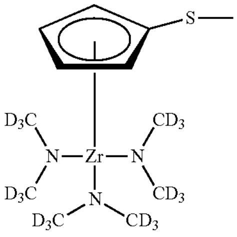
[Chemical Formula 4-10]
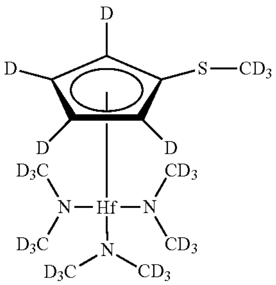
[Chemical Formula 4-11]
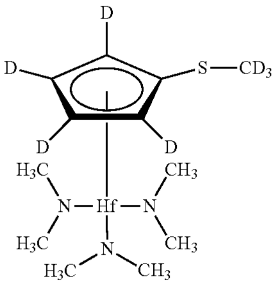
[Chemical Formula 4-12]
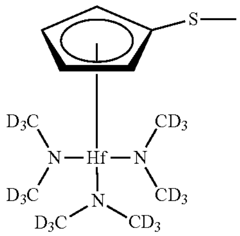
[Chemical Formula 4-13]
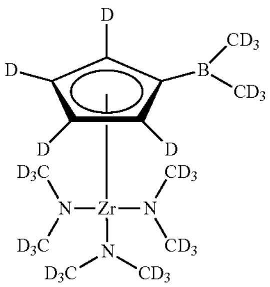
-continued
[Chemical Formula 4-14]
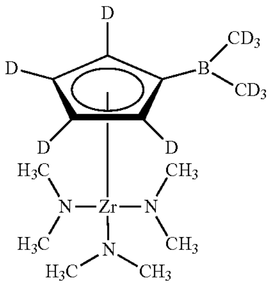
[Chemical Formula 4-15]
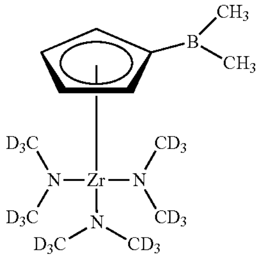
[Chemical Formula 4-16]
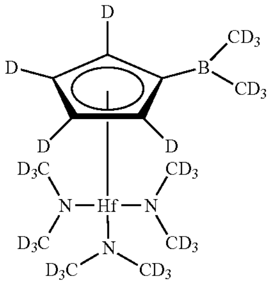
[Chemical Formula 4-17]
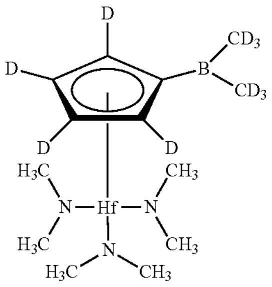
[Chemical Formula 4-18]
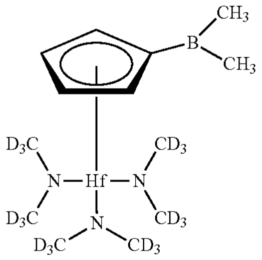

-continued
[Chemical Formula 4-19]
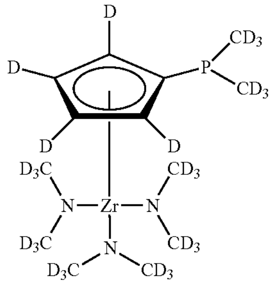
[Chemical Formula 4-20]
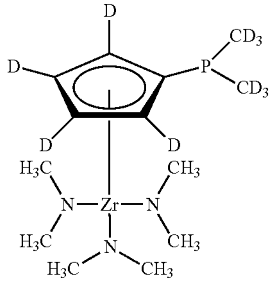
[Chemical Formula 4-21]
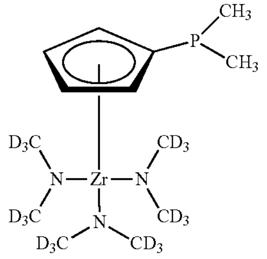
[Chemical Formula 4-22]
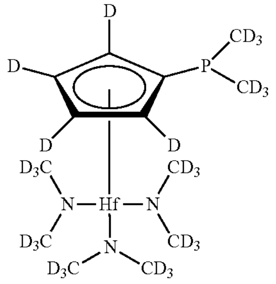
[Chemical Formula 4-23]
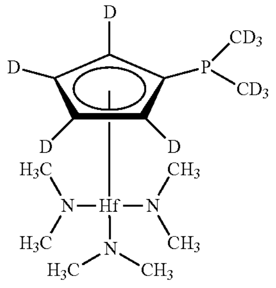
-continued
[Chemical Formula 4-24]
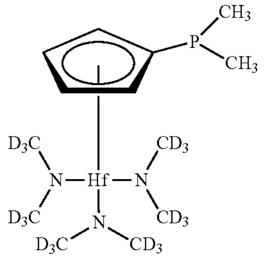
Chemical Formula 1 may be represented by any one of Chemical Formula 5-1 to Chemical Formula 5-15.
[Chemical Formula 5-1]
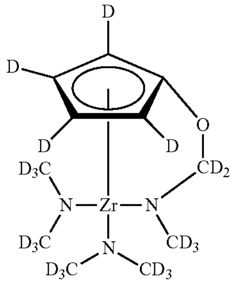
[Chemical Formula 5-2]
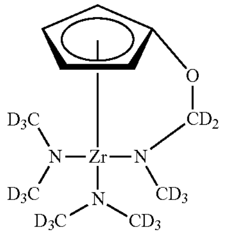
[Chemical Formula 5-3]
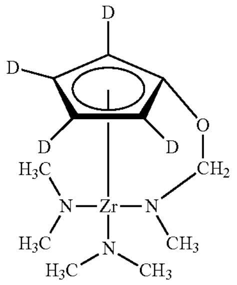
[Chemical Formula 5-4]
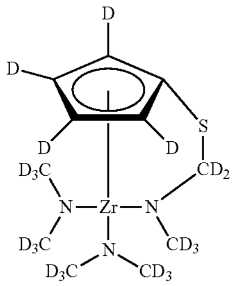

-continued
[Chemical Formula 5-5]
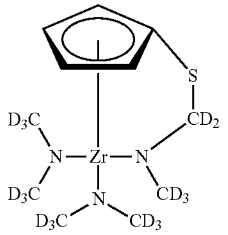
[Chemical Formula 5-6]
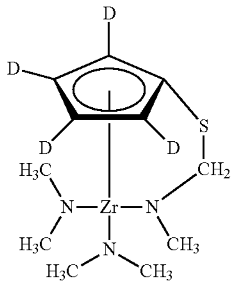
[Chemical Formula 5-7]
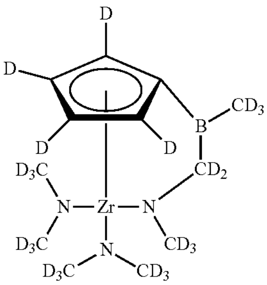
[Chemical Formula 5-8]
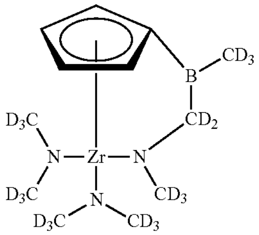
[Chemical Formula 5-9]
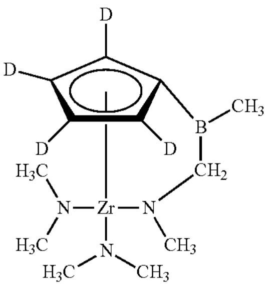
-continued
[Chemical Formula 5-10]
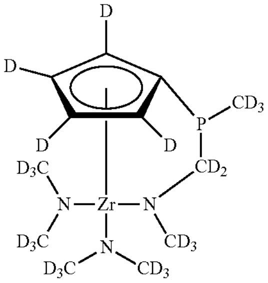
[Chemical Formula 5-11]
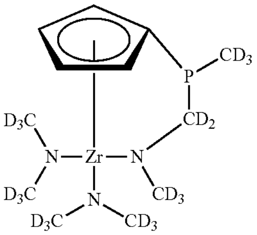
[Chemical Formula 5-12]
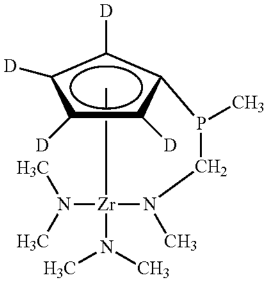
[Chemical Formula 5-13]
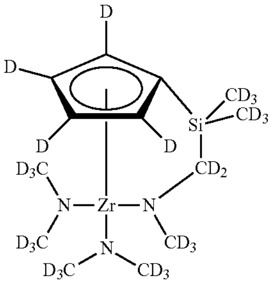
[Chemical Formula 5-14]
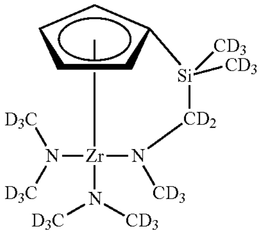

-continued
[Chemical Formula 5-15]
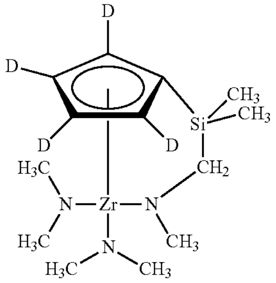
Chemical Formula 1 may be represented by any one of Chemical Formula 6-1 to Chemical Formula 6-15.
[Chemical Formula 6-1]
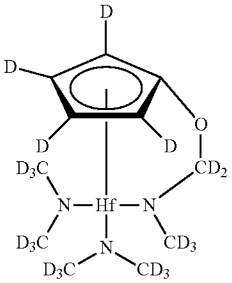
[Chemical Formula 6-2]
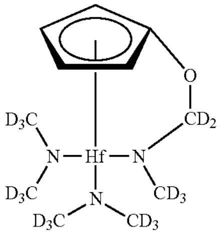
[Chemical Formula 6-3]
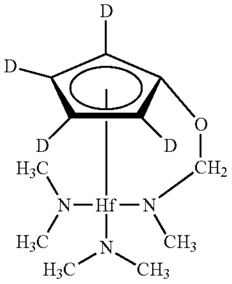
[Chemical Formula 6-4]
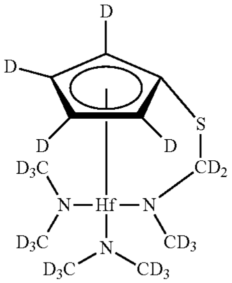
-continued
[Chemical Formula 6-5]
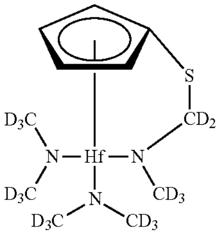
[Chemical Formula 6-6]
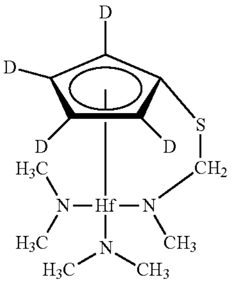
[Chemical Formula 6-7]
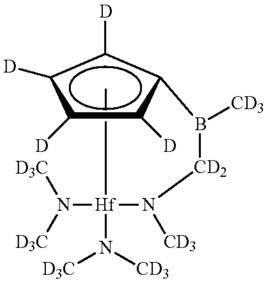
[Chemical Formula 6-8]
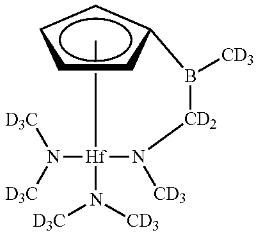
[Chemical Formula 6-9]
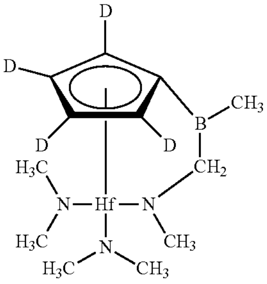

-continued
[Chemical Formula 6-10]
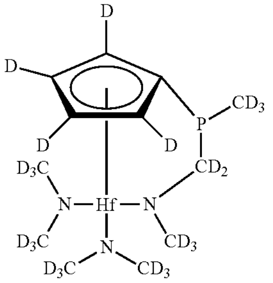
[Chemical Formula 6-11]
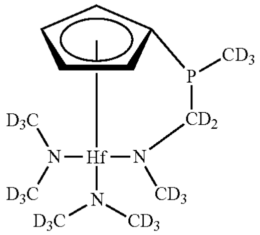
[Chemical Formula 6-12]
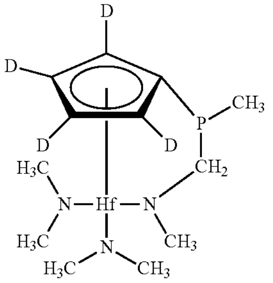
[Chemical Formula 6-13]
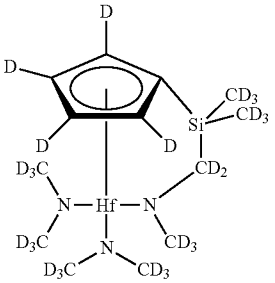
[Chemical Formula 6-14]
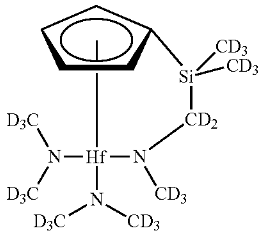
-continued
[Chemical Formula 6-15]
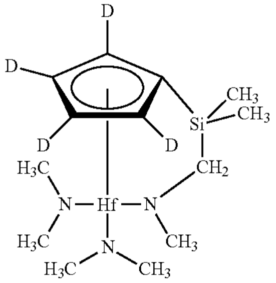
Chemical Formula 1 may be represented by any one of Chemical Formula 7-1 to Chemical Formula 7-15.
[Chemical Formula 7-1]
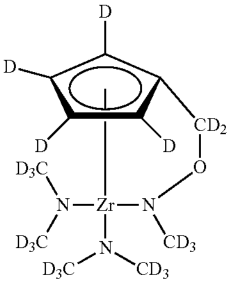
[Chemical Formula 7-2]
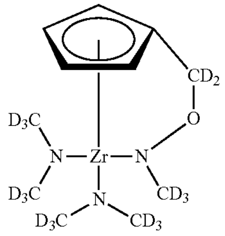
[Chemical Formula 7-3]
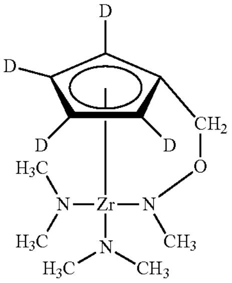
[Chemical Formula 7-4]
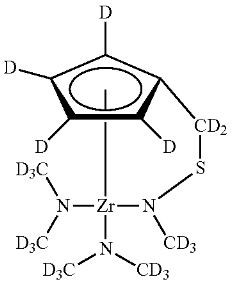

-continued
[Chemical Formula 7-5]
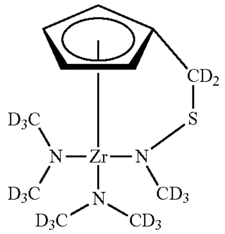
[Chemical Formula 7-6]
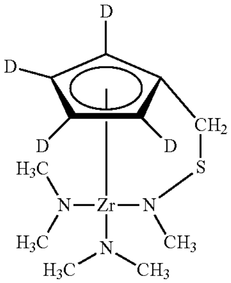
[Chemical Formula 7-7]
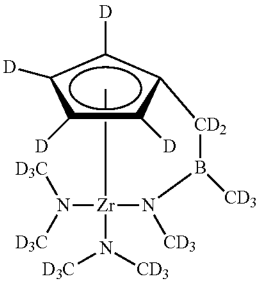
[Chemical Formula 7-8]
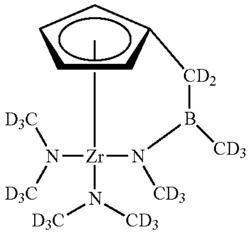
[Chemical Formula 7-9]
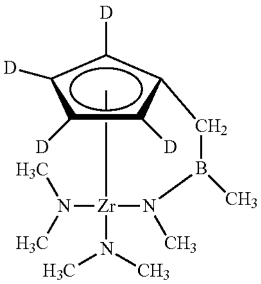
[Chemical Formula 7-10]
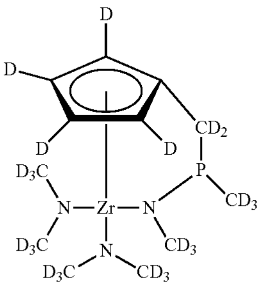
-continued
[Chemical Formula 7-11]
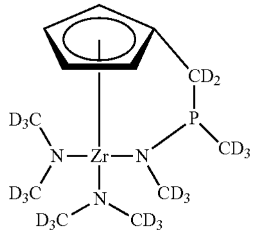
[Chemical Formula 7-12]
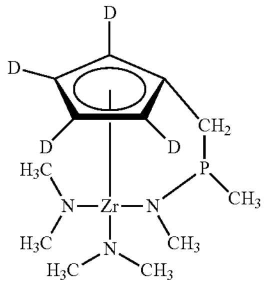
[Chemical Formula 7-13]
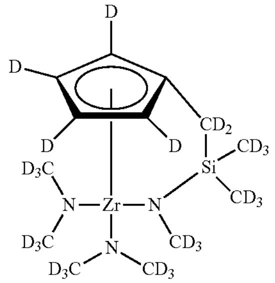
[Chemical Formula 7-14]
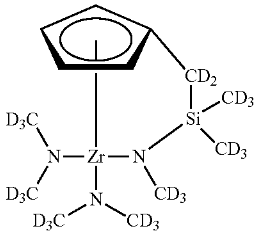
[Chemical Formula 7-15]
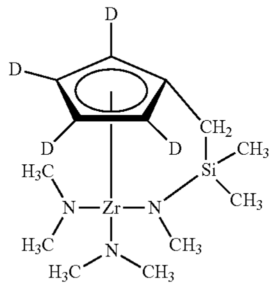
Chemical Formula 1 may be represented by any one of Chemical Formula 8-1 to Chemical Formula 8-15.

[Chemical Formula 8-1]
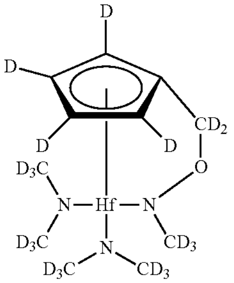
[Chemical Formula 8-2]
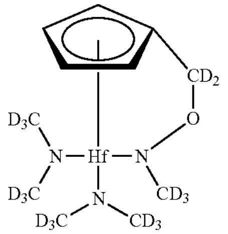
[Chemical Formula 8-3]
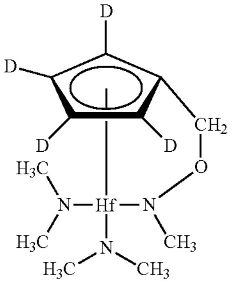
[Chemical Formula 8-4]
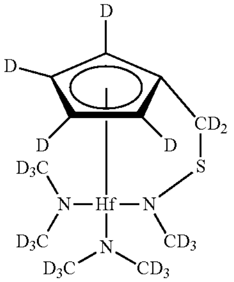
[Chemical Formula 8-5]
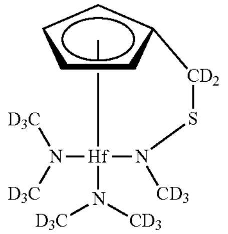
[Chemical Formula 8-6]
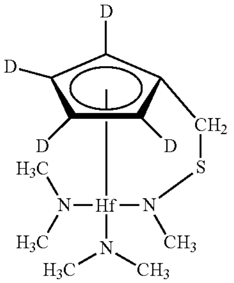
-continued
[Chemical Formula 8-7]
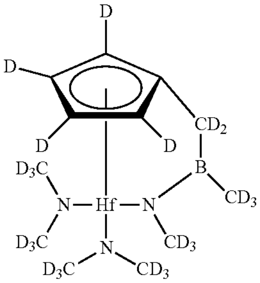
[Chemical Formula 8-8]
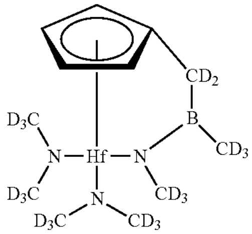
[Chemical Formula 8-9]
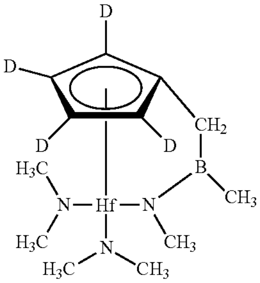
[Chemical Formula 8-10]
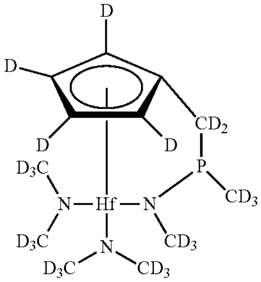
[Chemical Formula 8-11]
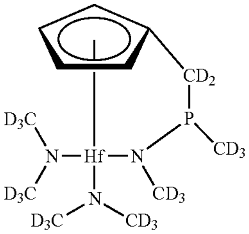
[Chemical Formula 8-12]
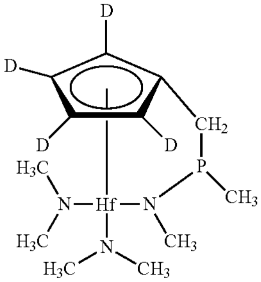

-continued
[Chemical Formula 8-13]
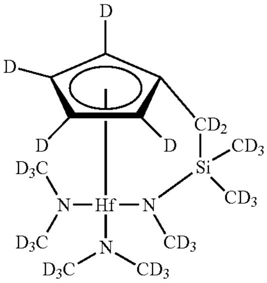
[Chemical Formula 8-14]
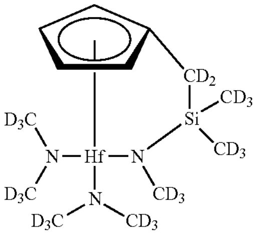
[Chemical Formula 8-15]
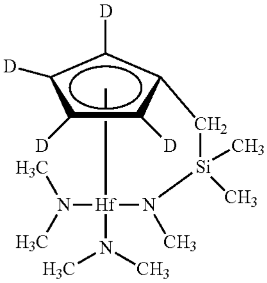
Chemical Formula 1 may be represented by any one of Chemical Formula 9-1 to Chemical Formula 9-18.
[Chemical Formula 9-1]
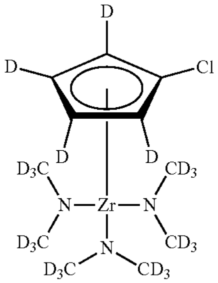
[Chemical Formula 9-2]
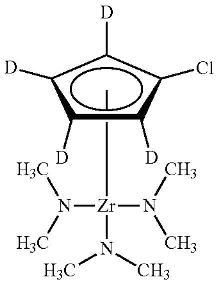
-continued
[Chemical Formula 9-3]
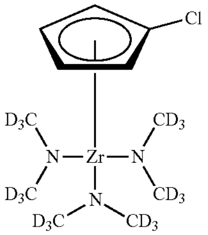
[Chemical Formula 9-4]
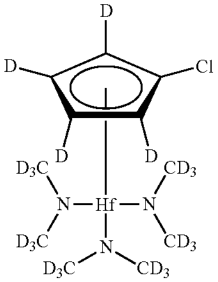
[Chemical Formula 9-5]
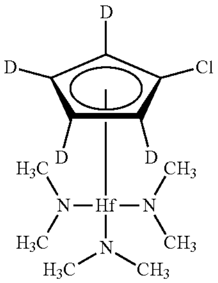
[Chemical Formula 9-6]
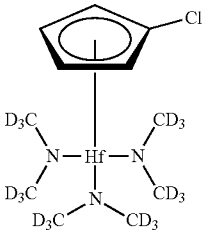
[Chemical Formula 9-7]
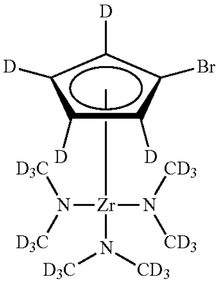

-continued
[Chemical Formula 9-8]
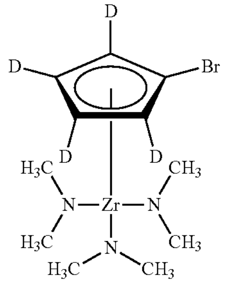
[Chemical Formula 9-9]
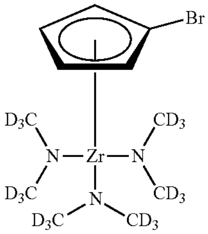
[Chemical Formula 9-10]
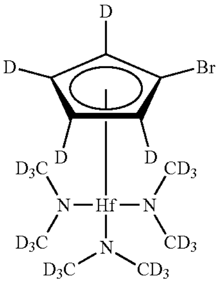
[Chemical Formula 9-11]
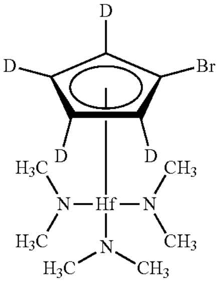
[Chemical Formula 9-12]
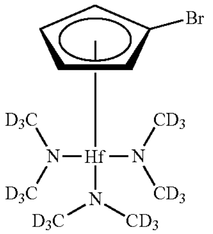
-continued
[Chemical Formula 9-13]
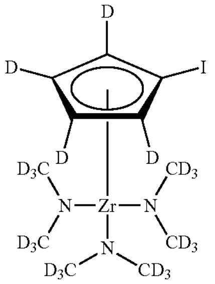
[Chemical Formula 9-14]
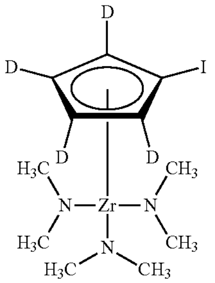
[Chemical Formula 9-15]
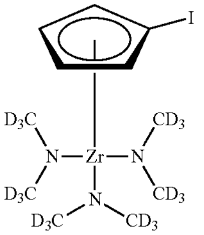
[Chemical Formula 9-16]
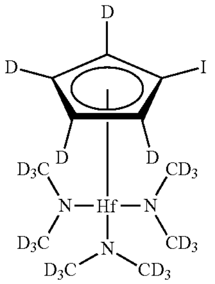
[Chemical Formula 9-17]
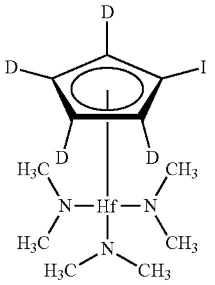

-continued

[Chemical Formula 9-18]

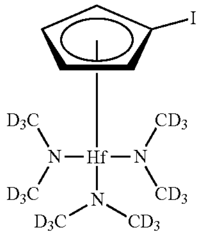

Another embodiment provides a method of fabricating a metal oxide thin film that includes: a first process of supplying the metal oxide thin film precursor to a substrate to adsorb the metal oxide thin film precursor on a surface of the substrate; a second process of supplying at least one of an oxygen-containing gas, a nitrogen-containing gas, and a plasma to react with the metal oxide thin film precursor to form a metal oxide thin film on the substrate; and sequentially repeating the first and second processes.

The oxygen-containing gas may include aqueous vapor ($H_2O$), oxygen ($O_2$), ozone ($O_3$), hydrogen peroxide ($H_2O_2$), nitrous oxide ($N_2O$), or a combination thereof.

The nitrogen-containing gas may include nitrogen ($N_2$), ammonia ($NH_3$), hydrazine ($N_2H_4$), nitrous oxide ($N_2O$), or a combination thereof.

The method of fabricating the metal oxide thin film may include an atomic layer deposition (ALD) method or a metal organic chemical vapor deposition (MOCVD) method.

Another embodiment provides a semiconductor device including a metal oxide thin film formed by the method of fabricating the metal oxide thin film.

Since the metal oxide thin film precursor according to an embodiment is not only liquid at room temperature and thus easy to store and handle but also has high volatility and thus a fast and easy deposition rate and also, excellent thermal stability and excellent crystalline thin film growth and thus high reactivity, the thin film manufactured by using the precursor has high purity and very excellent physical and electrical characteristics.

Accordingly, the metal oxide thin film, which is formed by using the metal oxide thin film precursor according to an embodiment, may improve leakage current characteristics and, when applied to a capacitor metal oxide thin film (dielectric layer), may improve capacitance.

DETAILED DESCRIPTION OF THE EMBODIMENTS

Figure 1:
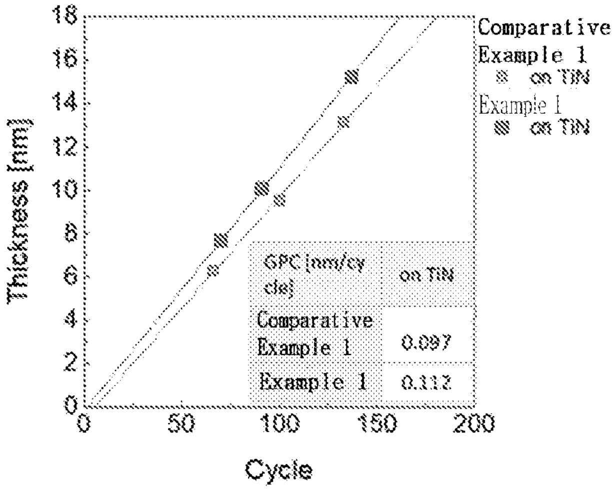
FIG. 1 is a graph showing thickness changes of metal oxide thin films ($ZrO_2$) according to repeating steps of forming the metal oxide thin films by respectively using the metal oxide thin film precursors according to Example 1 and Comparative Example 1.

Hereinafter, embodiments of the present invention are described in detail. However, these embodiments are exemplary, the present invention is not limited thereto, and the present invention is defined by the scope of claims.

As used herein, when a definition is not otherwise provided, "substituted" refers to replacement of at least one hydrogen of a substituent or a compound by deuterium, $NH_2$, a C1 to C4 amine group, a nitro group, a C1 to C4 silyl group, a C1 to C4 alkyl group, a C1 to C4 alkylsilyl group, a C1 to C4 alkoxy group, a fluoro group, a C1 to C4 trifluoroalkyl group, or a cyano group.

As used herein, when a definition is not otherwise provided, "alkyl group" refers to an aliphatic hydrocarbon group. The alkyl group may be "a saturated alkyl group" without any double bond or triple bond.

The alkyl group may be a C1 to C30 alkyl group. More specifically, the alkyl group may be a C1 to C20 alkyl group, a C1 to C10 alkyl group, a C1 to C6 alkyl group, or a C1 to C4 alkyl group. For example, a C1 to C4 alkyl group may have 1 to 4 carbon atoms in an alkyl chain which may be selected from methyl, ethyl, propyl, iso-propyl, n-butyl, iso-butyl, sec-butyl, and t-butyl.

Specific examples of the alkyl group may be a methyl group, an ethyl group, a propyl group, an isopropyl group, a butyl group, an isobutyl group, a t-butyl group, a pentyl group, a hexyl group, a cyclopropyl group, a cyclobutyl group, a cyclopentyl group, a cyclohexyl group, and the like.

As used herein, the term "heteroalkyl group" means a hetero group having an alkyl group as a substituent, which may include an alkoxy group, such as $*—X^1R$ ($X^1$ is an oxygen atom or a sulfur atom, and R is an alkyl group substituted or unsubstituted with deuterium) or $*—X^2R'R''$ ($X^1$ is a boron atom, nitrogen atom, or phosphorus atom, and R' and R'' are each independently a hydrogen atom or an alkyl group substituted or unsubstituted with deuterium, provided that at least one is necessarily an alkyl group substituted or unsubstituted with deuterium).

All the terms mentioned in the specification are easily understood to those who have common knowledge in a field related to this disclosure. In the present specification, the singular form also includes the plural form unless specifically stated otherwise in the description. As used herein, "comprises" and/or "comprising" do not exclude the presence or addition of one or more other components, steps, operations and/or devices of the mentioned components, steps, operations, and/or devices. In addition, whenever a film is referred to as being on another film or substrate, it is meant that it may be formed directly on the other film or substrate, or that a third film may be interposed between them.

Hereinafter, a metal oxide thin film precursor according to an embodiment is described.

The metal oxide thin film precursor according to an embodiment is represented by Chemical Formula 1.

[Chemical Formula 1]

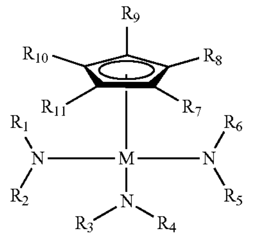

In Chemical Formula 1,

M is titanium (Ti), zirconium (Zr), or hafnium (Hf), $R^1$ to $R^6$ are each independently hydrogen, deuterium, a substituted or unsubstituted C1 to C6 alkyl group, a substituted or unsubstituted C2 to C6 alkenyl group, or a substituted or unsubstituted silyl group, and $R^7$ to $R^{11}$ are each independently hydrogen, deuterium, a halogen element, a substituted or unsubstituted C1 to C6 alkyl group, a substituted or unsubstituted C2 to C6 alkenyl group, a substituted or unsubstituted C1 to C6 heteroalkyl group, or a substituted or unsubstituted silyl group, provided that at least one of $R^7$ to $R^{11}$ is necessarily deuterium or at least one of $R^1$ to $R^6$ necessarily includes deuterium.

For example, at least one of $R^1$ to $R^6$ may be linked with at least one of $R^7$ to $R^{11}$ to form a fused ring.

For example, $R^1$ and $R^2$ may be linked with each other to form a fused ring.

For example, $R^2$ and $R^3$ may be linked with each other to form a fused ring. For example, $R^3$ and $R^4$ may be linked with each other to form a fused ring.

For example, $R^4$ and $R^5$ may be linked with each other to form a fused ring.

For example, $R^5$ and $R^6$ may be linked with each other to form a fused ring.

For example, at least one of $R^1$ and $R^2$ and at least one of $R^3$ and $R^4$ may be linked with each other to form a fused ring.

For example, at least one of $R^3$ and $R^4$ and at least one of $R^5$ and $R^6$ may be linked with each other to form a fused ring.

For example, at least one of $R^1$ and $R^2$ and at least one of $R^5$ and $R^6$ may be linked with each other to form a fused ring. The present inventors have developed a single organometallic precursor compound (metal oxide thin film precursor) including deuterium, which is highly volatile, exists as a liquid at room temperature, and is thermally stable, which can achieve excellent thin film properties, low thickness, and sufficient step covering by a metal organic chemical vapor deposition (MOCVD) method and/or an atomic layer deposition (ALD) method and furthermore, have completed a thin film deposition method (method of fabricating a metal oxide thin film) for forming a metal oxide thin film by a metal organic chemical vapor deposition (MOCVD) method and/or an atomic layer deposition (ALD) method using the aforementioned organometallic precursor compound.

The metal oxide thin film precursor represented by Chemical Formula 1 is stabilized by including a cyclopentadienyl group, an aromatic cyclic compound, which strengthens a bond between a metal and an amide group. As a result, the metal oxide thin film precursor according to an embodiment may be more thermally stable than a metal precursor including only amide groups and not including conventional aromatic cyclic compounds, resulting in an increased thermal decomposition temperature.

In addition, the metal oxide thin film precursor represented by Chemical Formula 1 may exhibit a high vapor pressure, wherein three amide groups capable of causing the high vapor pressure are bonded to a central metal. In addition, the metal oxide thin film precursor represented by Chemical Formula 1 forms no corrosive product such as HCl as a by-product during the deposition, thereby preventing corrosion of a device.

Furthermore, the metal oxide thin film precursor represented by Chemical Formula 1, in which at least one among five carbons constituting the cyclopentadienyl group is necessarily substituted with deuterium (and/or a halogen element), or an alkyl group, an alkenyl group, or a silyl group substituted in the amide group is necessarily substituted with deuterium, changing the number of neutrons of the compound and thus causing a change in mass, exhibits very stable characteristics unlike other isotopes. In addition, when the deuterium substitutes hydrogen, an isotope, vibrational energy including atoms is changed, increasing thermal stability due to the isotope effect and resulting in reducing a leakage current. This may serve to increase a thermal decomposition temperature of the metal oxide thin film precursor and widening a process window of a process temperature to set a higher process temperature in a process described later and also affect crystallinity of the metal oxide thin film and formation of crystalline phases with a high dielectric constant and result in increasing a dielectric constant of the metal oxide thin film (dielectric layer). This increase in the dielectric constant and decrease in the leakage current ultimately increase capacitance, inducing improved performance of a capacitor.

In Chemical Formula 1, when at least one of $R^7$ to $R^{11}$ is necessarily deuterium, or at least one of $R^1$ to $R^6$ necessarily includes the deuterium, compared with a material substituted with hydrogen, even though the number of electrons is the same, a molecular weight is increased, resulting in increasing a boiling point. In fact, the deuterium-substituted cyclopentadienyl tris(dimethylamino) zirconium(cyclopentadienyl tris(dimethylamino) zirconium) material has a boiling point of 90° C. at 0.1 torr, which is about 7° C. higher than that of the hydrogen-substituted material. In addition, a deuterium-substituted cyclopentadienyl tris(dimethylamino) hafnium material has a boiling point of about 88° C. at about 0.1 torr, which is about 4° C. higher than that of a hydrogen-substituted material. In view of these characteristics, since the deuterium-substituted material produces $ZrO_2$ and $HfO_2$ at a relatively higher temperature than the hydrogen-substituted material, and crystallinity of $ZrO_2$ and $HfO_2$ produced at the higher temperature, which is caused by easiness that crystals of the material find their places, increases, inducing an increase in a dielectric constant. As a result, when the metal oxide thin film precursor according to an embodiment, high capacitance may be achieved.

For example, at least two, for example at least three, for example at least four of $R^7$ to $R^{11}$ may be necessarily deuterium.

For example, all of $R^7$ to $R^{11}$ may be deuterium. Herein, among metal oxide thin film crystalline phases formed by using the metal oxide thin film precursor represented by Chemical Formula 1, tetragonal phased crystals with a large dielectric constant may be more easily formed, thereby providing a capacitor with increased capacitance.

For example, $R^1$ to $R^6$ may each independently be a substituted or unsubstituted C1 to C6 alkyl group. When the amide group is an alkylamide group, for example, an alkylamide group substituted with deuterium, a sufficient vapor pressure may be secured, which is advantageous in forming a uniform thin film.

For example, at least one of $R^1$ to $R^6$ may be a C1 to C6 alkyl group substituted with deuterium.

For example, $R^6$ and $R^8$ may be linked with each other to form a fused ring.

For example, $R^3$ and $R^4$ may be linked with each other to form a fused ring.

For example, $R^4$ and $R^5$ may be linked with each other to form a fused ring.

For example, at least two of $R^7$ to $R^{11}$ may necessarily be deuterium.

For example, at least one of $R^7$ to $R^{11}$ may be a halogen element.

For example, M may be Hf, which can further increase the process rate when applied to an atomic layer deposition method.

For example, the metal oxide thin film precursor represented by Chemical Formula 1 may be represented by Chemical Formula 2-1 or Chemical Formula 2-2, but is not necessarily limited thereto.

[Chemical Formula 2-1]

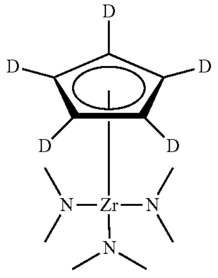

[Chemical Formula 2-2]

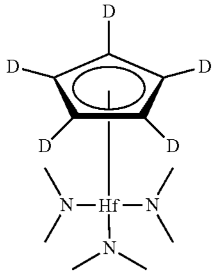

Chemical Formula 1 may be represented by any one of Chemical Formula 3-1 to Chemical Formula 3-18.

[Chemical Formula 3-1]

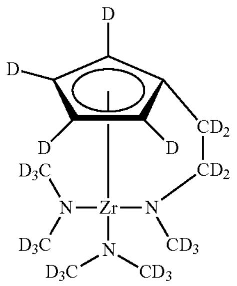

[Chemical Formula 3-2]

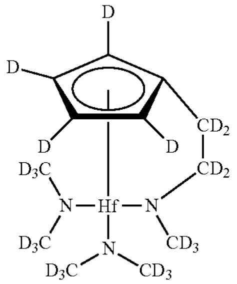

[Chemical Formula 3-3]

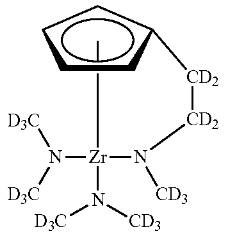

[Chemical Formula 3-4]

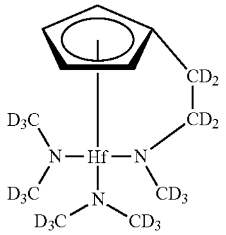

[Chemical Formula 3-5]

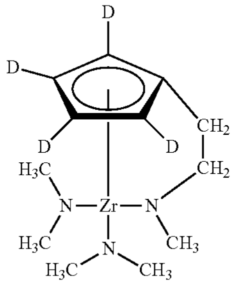

-continued
[Chemical Formula 3-6]
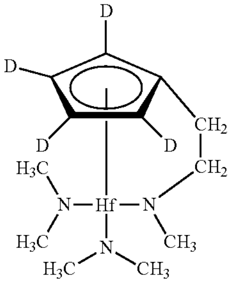
[Chemical Formula 3-7]
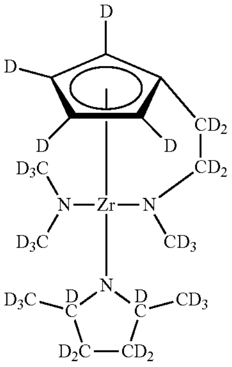
[Chemical Formula 3-8]
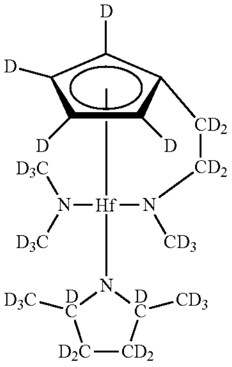
[Chemical Formula 3-9]
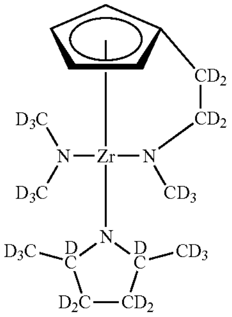
-continued
[Chemical Formula 3-10]
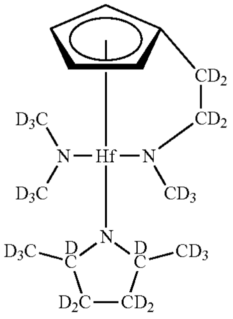
[Chemical Formula 3-11]
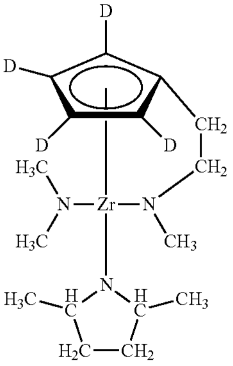
[Chemical Formula 3-12]
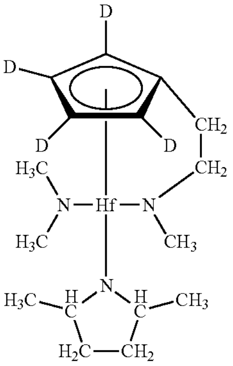
[Chemical Formula 3-13]
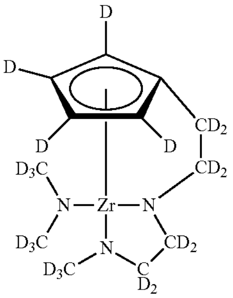

-continued
[Chemical Formula 3-14]
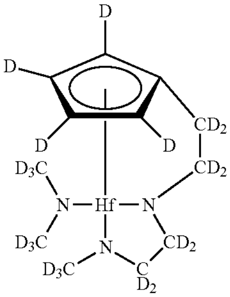
[Chemical Formula 3-15]
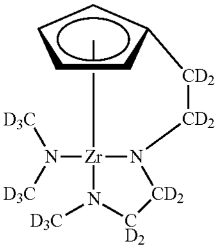
[Chemical Formula 3-16]
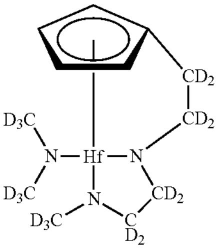
[Chemical Formula 3-17]
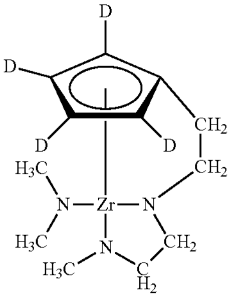
[Chemical Formula 3-18]
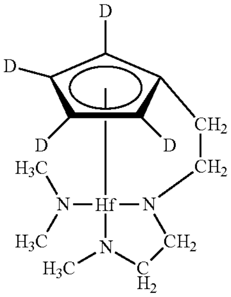
Chemical Formula 1 may be represented by any one of Chemical Formula 4-1 to Chemical Formula 4-24.
[Chemical Formula 4-1]
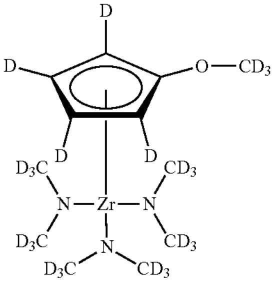
[Chemical Formula 4-2]
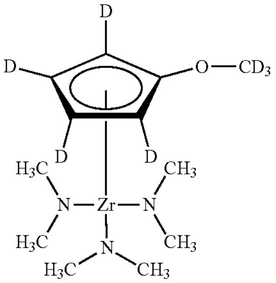
[Chemical Formula 4-3]
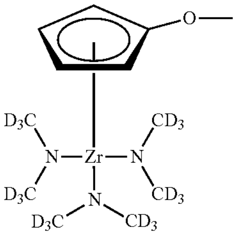
[Chemical Formula 4-4]
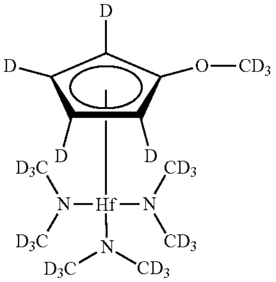
[Chemical Formula 4-5]
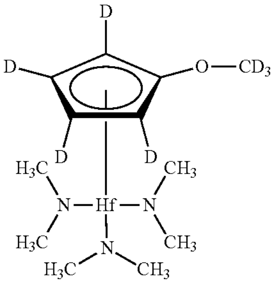

-continued
[Chemical Formula 4-6]
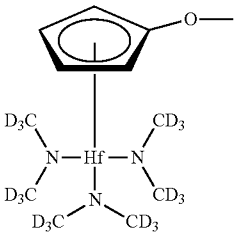
[Chemical Formula 4-7]
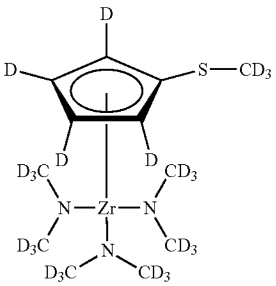
[Chemical Formula 4-8]
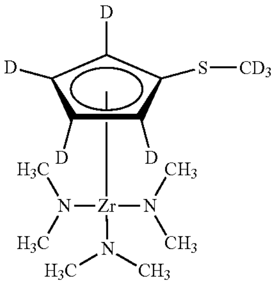
[Chemical Formula 4-9]
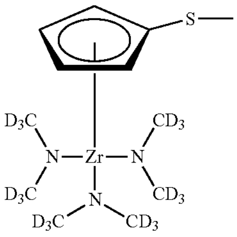
[Chemical Formula 4-10]
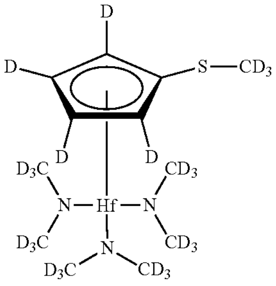
-continued
[Chemical Formula 4-11]
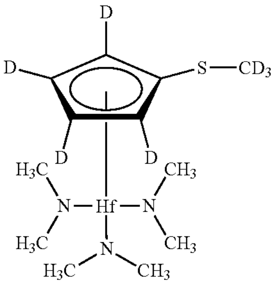
[Chemical Formula 4-12]
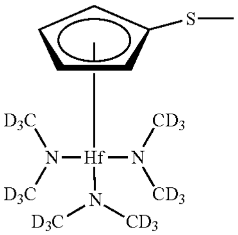
[Chemical Formula 4-13]
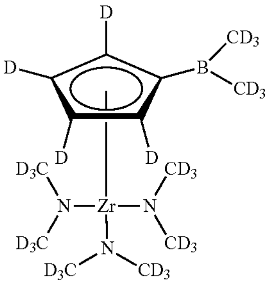
[Chemical Formula 4-14]
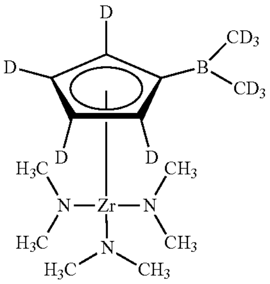
[Chemical Formula 4-15]
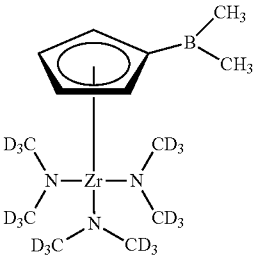

-continued
[Chemical Formula 4-16]
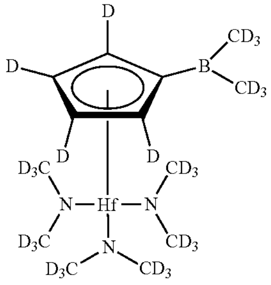
[Chemical Formula 4-17]
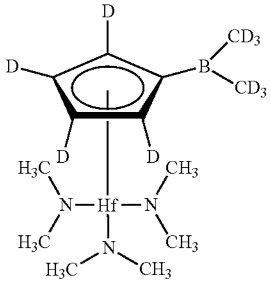
[Chemical Formula 4-18]
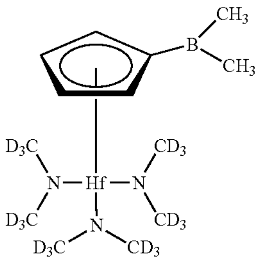
[Chemical Formula 4-19]
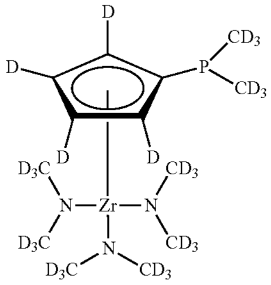
[Chemical Formula 4-20]
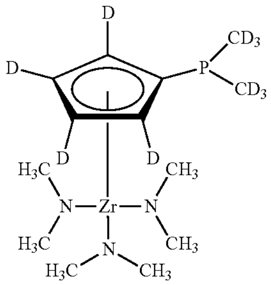
-continued
[Chemical Formula 4-21]
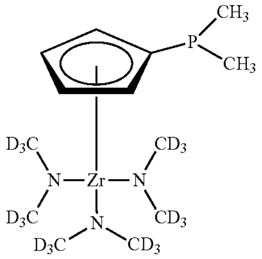
[Chemical Formula 4-22]
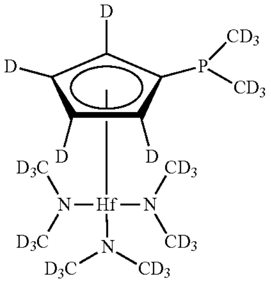
[Chemical Formula 4-23]
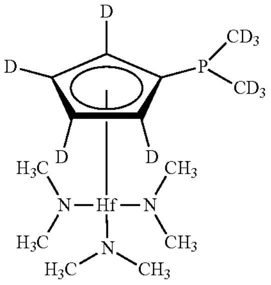
[Chemical Formula 4-24]
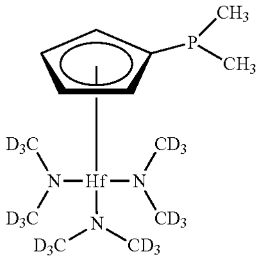
Chemical Formula 1 may be represented by any one of Chemical Formula 5-1 to Chemical Formula 5-15.
[Chemical Formula 5-1]
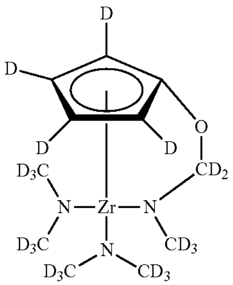

-continued
[Chemical Formula 5-2]
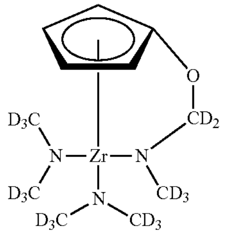
[Chemical Formula 5-3]
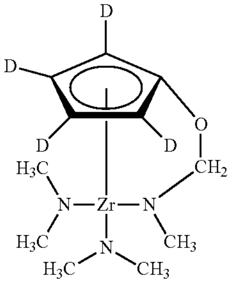
[Chemical Formula 5-4]
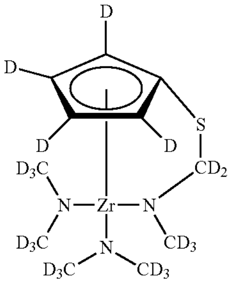
[Chemical Formula 5-5]
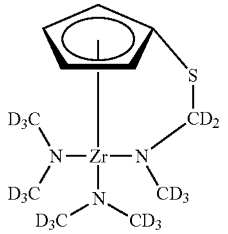
[Chemical Formula 5-6]
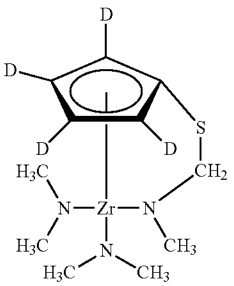
-continued
[Chemical Formula 5-7]
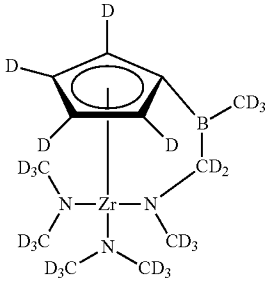
[Chemical Formula 5-8]
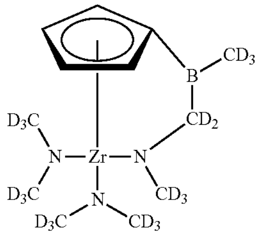
[Chemical Formula 5-9]
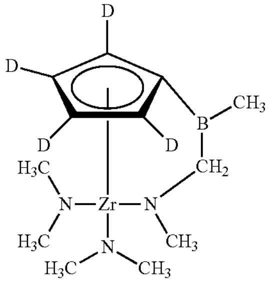
[Chemical Formula 5-10]
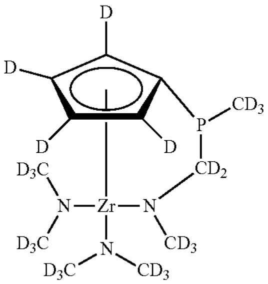
[Chemical Formula 5-11]
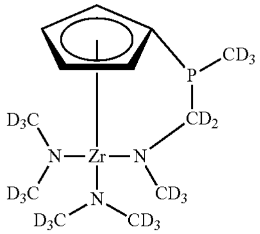

-continued
[Chemical Formula 5-12]
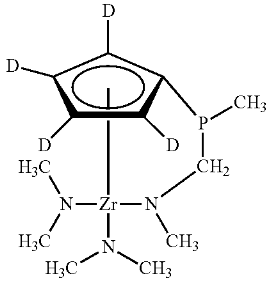
[Chemical Formula 5-13]
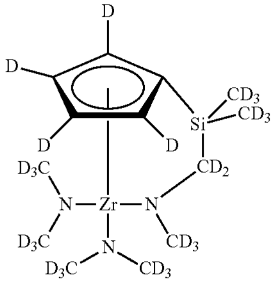
[Chemical Formula 5-14]
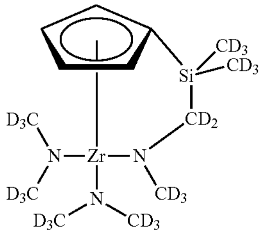
[Chemical Formula 5-15]
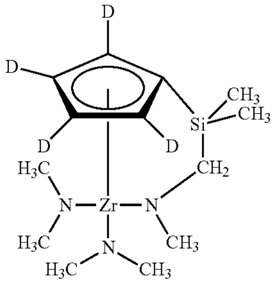
Chemical Formula 1 may be represented by any one of Chemical Formula 6-1 to Chemical Formula 6-15.
[Chemical Formula 6-1]
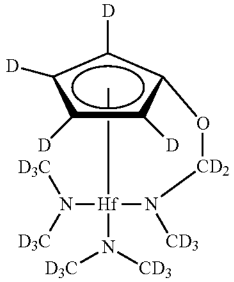
-continued
[Chemical Formula 6-2]
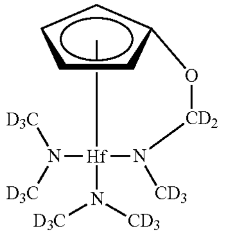
[Chemical Formula 6-3]
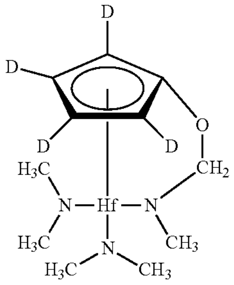
[Chemical Formula 6-4]
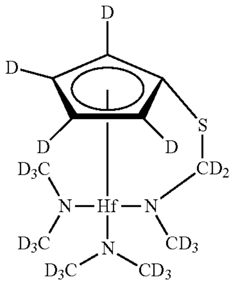
[Chemical Formula 6-5]
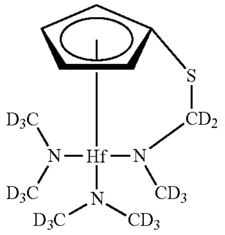
[Chemical Formula 6-6]
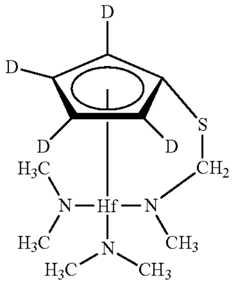
[Chemical Formula 6-7]
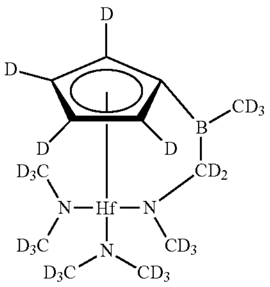

-continued
[Chemical Formula 6-8]
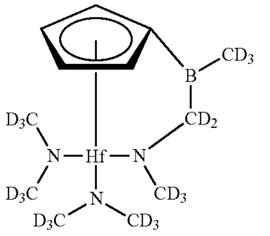
[Chemical Formula 6-9]
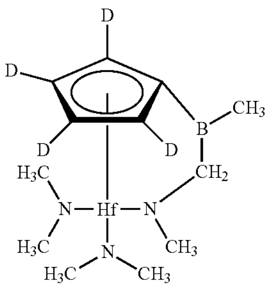
[Chemical Formula 6-10]
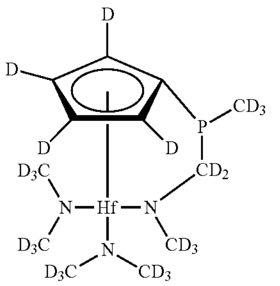
[Chemical Formula 6-11]
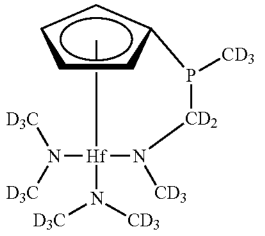
[Chemical Formula 6-12]
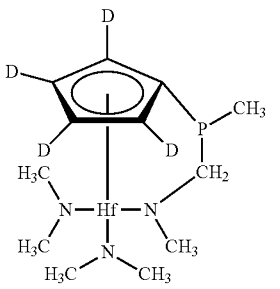
-continued
[Chemical Formula 6-13]
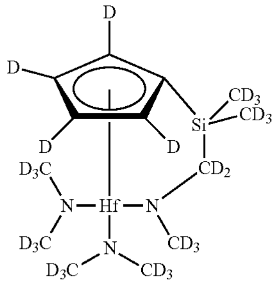
[Chemical Formula 6-14]
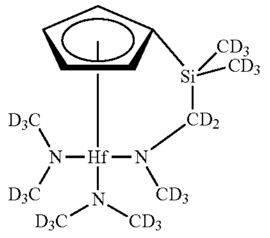
[Chemical Formula 6-15]
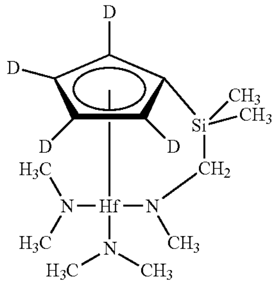
Chemical Formula 1 may be represented by any one of Chemical Formula 7-1 to Chemical Formula 7-15.
[Chemical Formula 7-1]
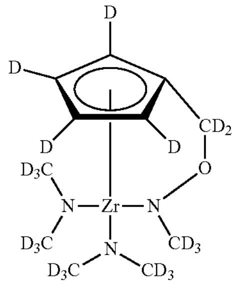
[Chemical Formula 7-2]
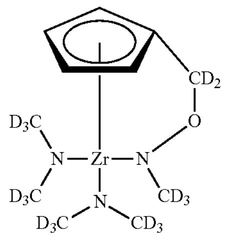

-continued
[Chemical Formula 7-3]
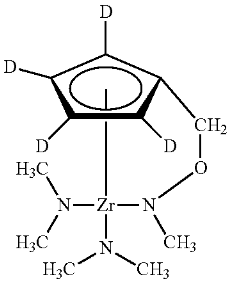
[Chemical Formula 7-4]
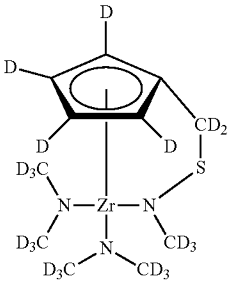
[Chemical Formula 7-5]
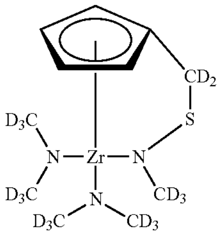
[Chemical Formula 7-6]
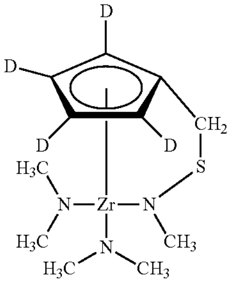
[Chemical Formula 7-7]
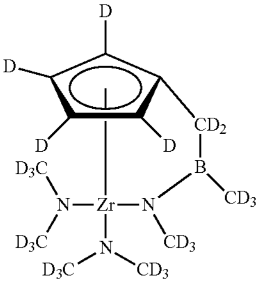
[Chemical Formula 7-8]
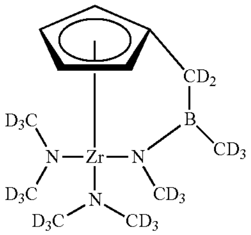
-continued
[Chemical Formula 7-9]
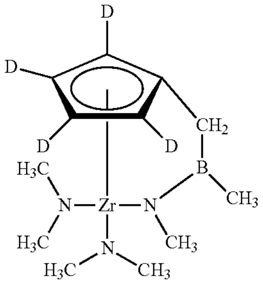
[Chemical Formula 7-10]
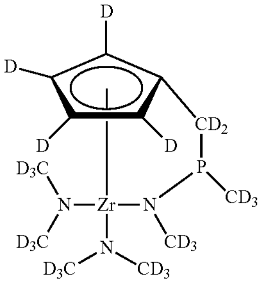
[Chemical Formula 7-11]
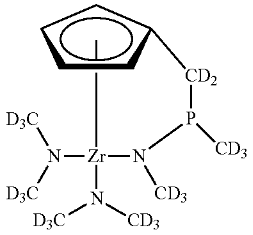
[Chemical Formula 7-12]
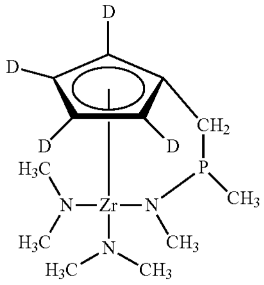
[Chemical Formula 7-13]
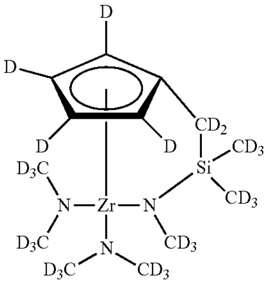
[Chemical Formula 7-14]
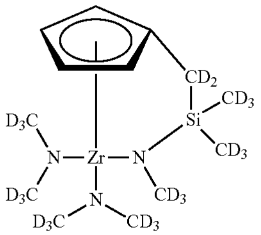

-continued
[Chemical Formula 7-15]
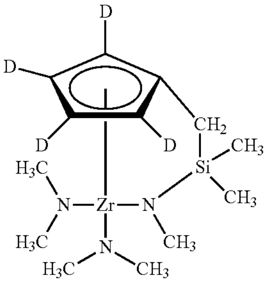
Chemical Formula 1 may be represented by any one of Chemical Formula 8-1 to Chemical Formula 8-15.
[Chemical Formula 8-1]
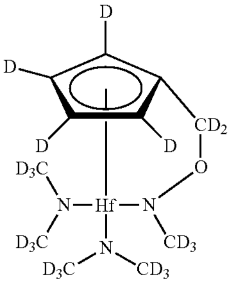
[Chemical Formula 8-2]
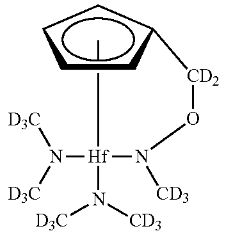
[Chemical Formula 8-3]
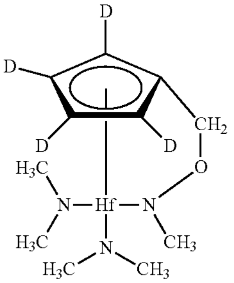
[Chemical Formula 8-4]
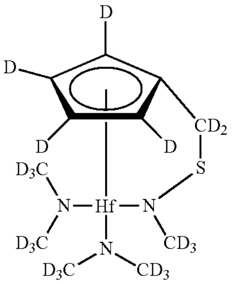
-continued
[Chemical Formula 8-5]
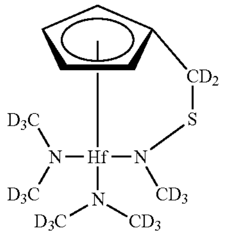
[Chemical Formula 8-6]
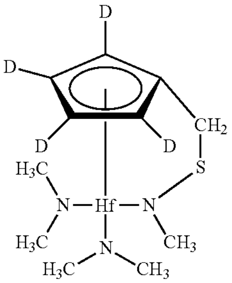
[Chemical Formula 8-7]
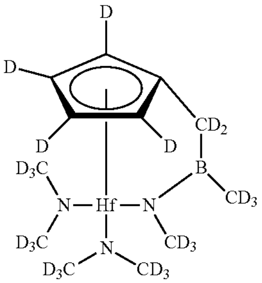
[Chemical Formula 8-8]
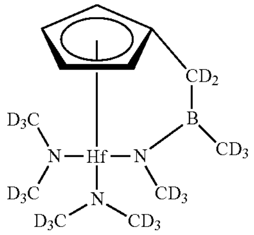
[Chemical Formula 8-9]
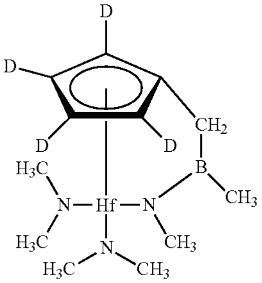
[Chemical Formula 8-10]
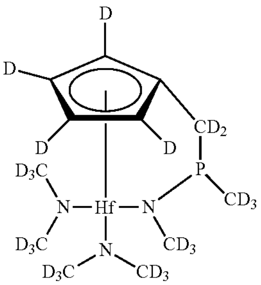

-continued
[Chemical Formula 8-11]
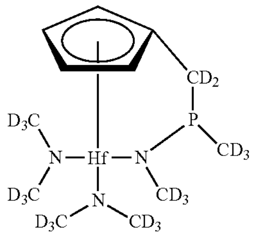
[Chemical Formula 8-12]
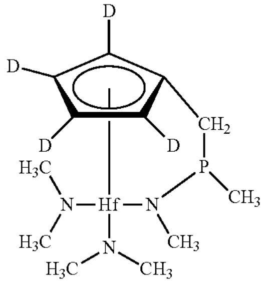
[Chemical Formula 8-13]
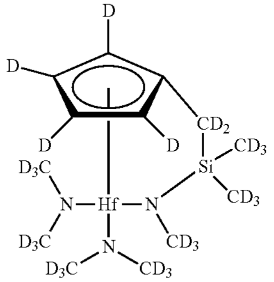
[Chemical Formula 8-14]
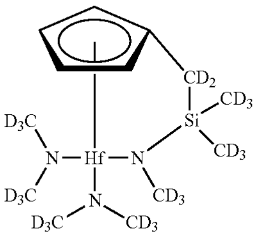
[Chemical Formula 8-15]
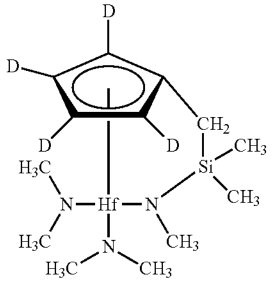
Chemical Formula 1 may be represented by any one of Chemical Formula 9-1 to Chemical Formula 9-18.
[Chemical Formula 9-1]
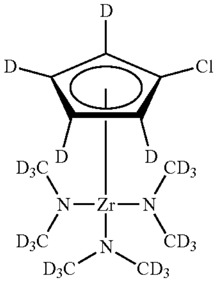
[Chemical Formula 9-2]
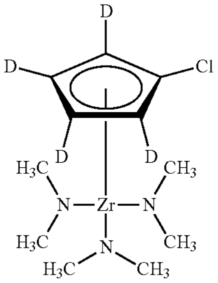
[Chemical Formula 9-3]
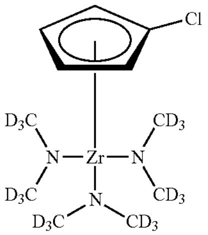
[Chemical Formula 9-4]
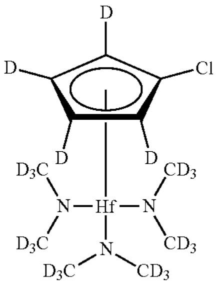
[Chemical Formula 9-5]
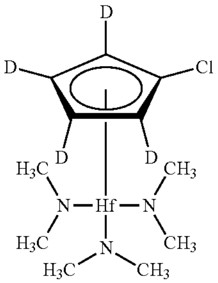
[Chemical Formula 9-6]
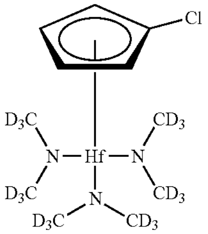

-continued
[Chemical Formula 9-7]
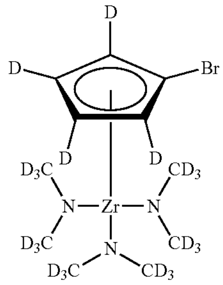
[Chemical Formula 9-8]
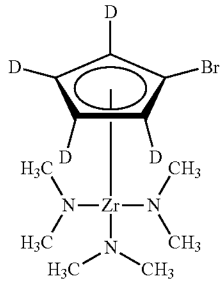
[Chemical Formula 9-9]
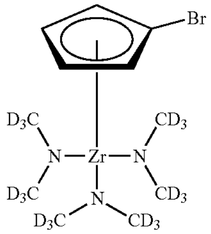
[Chemical Formula 9-10]
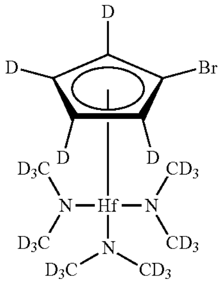
[Chemical Formula 9-11]
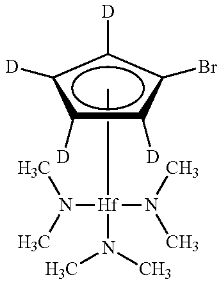
[Chemical Formula 9-12]
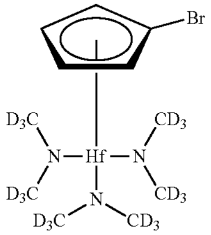
-continued
[Chemical Formula 9-13]
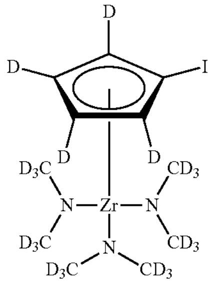
[Chemical Formula 9-14]
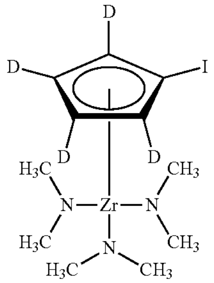
[Chemical Formula 9-15]
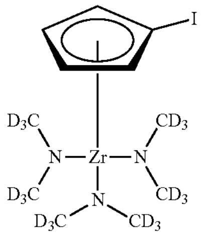
[Chemical Formula 9-16]
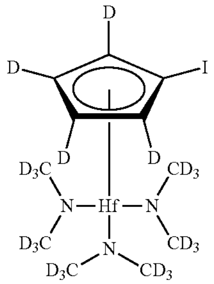
[Chemical Formula 9-17]
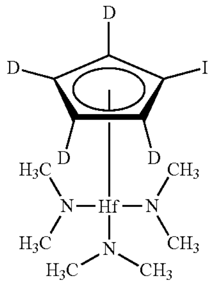

-continued

[Chemical Formula 9-18]

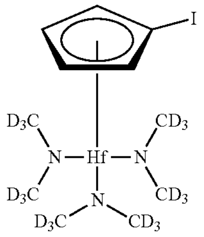

In another embodiment, provided is a metal oxide thin film formed by depositing the aforementioned metal oxide thin film precursor on a substrate.

According to another embodiment, a method of forming said metal oxide thin film is provided. Hereinafter, a method of fabricating the metal oxide thin film is described in detail.

The method of fabricating the metal oxide thin film includes: a first process of supplying the metal oxide thin film precursor to a substrate to adsorb the metal oxide thin film precursor on a surface of the substrate; a second process of supplying at least one of an oxygen-containing gas, a nitrogen-containing gas, and a plasma to react with the metal oxide thin film precursor to form a metal oxide thin film on the substrate; and sequentially repeating the first and second processes.

For example, the substrate may be a silicon wafer, a SOI (Silicon on Insulator) substrate, or titanium nitride (TiN).

In order to form the metal oxide thin film, the substrate may be placed in a deposition chamber, and the metal oxide thin film precursor represented by Chemical Formula 1 may be supplied into the deposit chamber. When the metal oxide thin film precursor according to an embodiment may be deposited on the substrate, the deposition temperature may be about 100° C. to about 1000° C. A method of transferring the metal oxide thin film precursor onto the substrate is not particularly limited but may be selected from a volatilized gas transfer method, a direct liquid injection (DLI) method, a liquid transfer method of transferring the metal oxide thin film precursor after dissolving it in an organic solvent, or the like.

The metal oxide thin film precursor may be supplied into the chamber after it is gasified. The supplied metal oxide thin film precursor may be deposited on the surface of the substrate. Then, not-adsorbed gases of the metal oxide thin film precursor into the surface of the substrate are purged out. And, oxygen-containing gas, nitrogen-containing gas, plasma, or a combination thereof is supplied into the chamber to react it with the metal oxide thin film precursor on the surface of the substrate to form a metal oxide layer as one atomic thin film layer. The oxygen-containing gas may include aqueous vapor ($H_2O$), oxygen ($O_2$), ozone ($O_3$), hydrogen peroxide ($H_2O_2$), nitrous oxide ($N_2O$), or a combination thereof. The nitrogen-containing gas may include nitrogen ($N_2$), ammonia ($NH_3$), hydrazine ($N_2H_4$), nitrous oxide ($N_2O$), or a combination thereof. In the metal oxide thin film precursor, other ligands bonded to a metal (for example, zirconium) may be combined with the oxygen-containing gas or the nitrogen-containing gas and thus changed into gases such as carbon dioxide, aqueous vapor, nitrogen dioxide, etc. These by-products are purged out of the chamber. This process is repeated n times to form a metal oxide thin film having a predetermined thickness. Herein, the n corresponds to a positive integer. Through the n times repetition, the metal oxide thin film (dielectric layer) may have a uniform atom distribution.

For example, on the metal oxide thin film, a conductive layer may be additionally formed at about 500° C. or higher. For example, the conductive layer may be a tungsten layer. While the conductive layer is formed, the metal atoms may be diffused.

For example, the metal oxide thin film may correspond to a dielectric layer of a capacitor but to a gate insulating layer. The conductive layer may correspond to an upper electrode or a gate electrode of a capacitor. When the metal oxide thin film is a capacitor metal oxide thin film, a lower electrode may be formed before forming the metal oxide thin film.

As described above, the metal oxide thin film may be formed by an atomic layer deposition (ALD) method or a metal organic chemical vapor deposition (MOCVD) method.

In another embodiment, provided is a semiconductor device that includes a thin film formed by deposition of a metal oxide thin film precursor as described above, or a metal oxide thin film formed by a method of forming a metal oxide thin film as described above.

Hereinafter, specific embodiments of the present invention are described. However, the embodiments described below are intended only to specifically illustrate or describe the present invention and should not be construed as limiting the invention.

Example 1: Synthesis of Compound Represented by Chemical Formula 2-1

[Reaction Scheme]

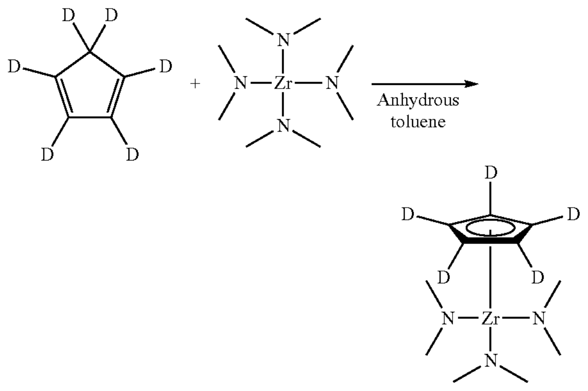

Preparing Method of Chemical Formula 1-1

80 ml of anhydrous toluene is injected into a 250 ml flame-dried flask under a nitrogen atmosphere, and 5 g (18.7 mmol) of the tetrakis dimethylamido zirconium (IV) is added thereto and then cooled to −78° C. After the cooling, 1.55 g (21.4 mmol) of cyclopentadiene-$d_6$ is slowly added dropwise thereto by using a dropping funnel. After completing the addition, the reactant is slowly heated up to −40° C. and then stirred. When the reaction is completed, after removing solvents and volatile by-products by using vacuum, the residue is distilled under a reduced pressure (6.0 mmHg, 130° C.), obtaining 3.34 g (yield: 62%) of cyclopentadienyl-$d_5$ tris(dimethylamino) zirconium (represented by Chemical Formula 2-1), a liquid title compound.

$^1H$ NMR ($CD_6$): δ 2.86 (s, 18H)

Example 2: Synthesis of Compound Represented by Chemical Formula 2-2

[Reaction Scheme]

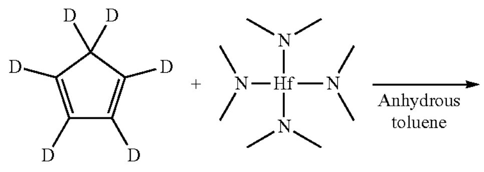

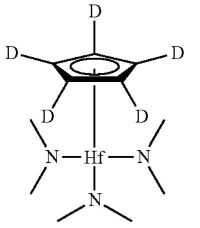

80 ml of anhydrous toluene is injected into a 250 ml flame-dried flask under a nitrogen atmosphere, and 6.63 g (18.7 mmol) of the tetrakis dimethylamido zirconium (IV) is added thereto and then cooled to −78° C. After the cooling, 1.55 g (21.4 mmol) of cyclopentadiene-$d_6$ is slowly added dropwise thereto by using a dropping funnel. After completing the addition, the reactant is slowly heated up to −40° C. and then stirred. When the reaction is completed, after removing solvents and volatile by-products by using vacuum, the residue is distilled under a reduced pressure (6.0 mmHg, 130° C.), obtaining 5.74 g (yield: 70%) of cyclopentadienyl-$d_5$ tris(dimethylamino) zirconium (represented by Chemical Formula 2-2), a liquid title compound.

$^1$H NMR ($CD_6$): δ 2.89 (s, 18H)

Comparative Example 1: Synthesis of Compound Represented by Chemical Formula C-1

[Chemical Formula C-1]

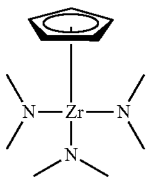

A compound represented by Chemical Formula C-1 is obtained in the same manner as in Synthesis Example 1 except that cyclopentadiene is used instead of the cyclopentadiene-$d_6$.

$^1$H NMR ($CD_6$): δ 6.06 (s, 4H), 2.92 (s, 18H)

Comparative Example 2: Synthesis of Compound Represented by Chemical Formula C-2

[Chemical Formula C-2]

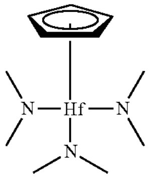

A compound represented by Chemical Formula C-2 is obtained in the same manner as in Synthesis Example 1 except that cyclopentadiene is used instead of the cyclopentadiene-$d_6$.

$^1$H NMR ($CD_6$): δ 6.0 (s, 5H), 3.0 (s, 18H)

Evaluation

1. Evaluation of $ZrO_2$ ALD Growth Behavior $ZrO_2$ (@300° C.)

Figure 2:
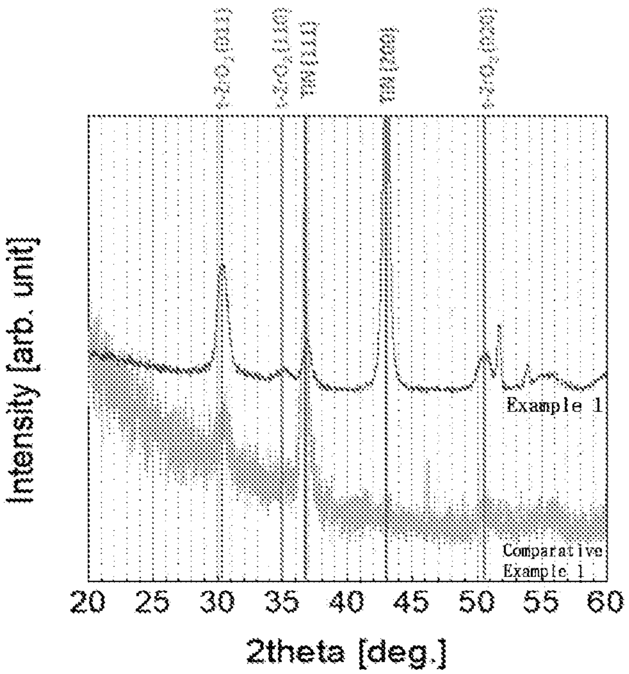
FIG. 2 is a graph showing crystallinity of the metal oxide thin films ($ZrO_2$) formed by respectively using the metal oxide thin film precursors according to Example 1 and Comparative Example 1.
Figure 3:
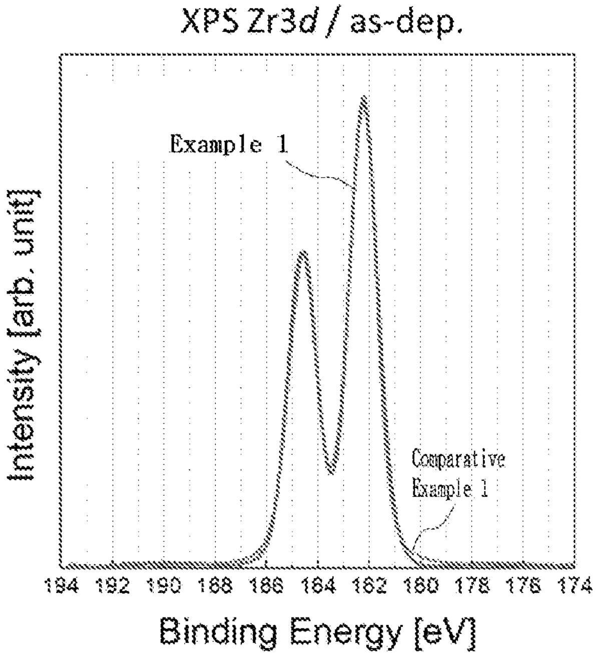
FIG. 3 is an XPS (X-ray photoelectron spectroscopy) graph of the metal oxide thin films ($ZrO_2$) formed by respectively using the metal oxide thin film precursors according to Example 1 and Comparative Example 1.

The metal oxide thin film precursors (Chemical Formulas 1-1 and C-1) according to Example 1 and Comparative Example 1 were used respectively to form metal oxide thin films ($ZrO_2$), and then growth behaviors of the films are evaluated, and the results are shown in FIGS. 1 to 3. Herein, TiN was used as a substrate.

Specifically, as the steps of forming the metal oxide thin films were repeated, thickness changes of the metal oxide thin films were examined, and the results are shown in FIG. 1.

Referring to FIG. 1, Example 1 and Comparative Example 1 exhibited a linear thickness growth according to an increase in cycle numbers, and in addition, Example 1 and Comparative Example 1 exhibited almost no incubation cycle (x-intercept) of less than 10 cycles, but Example 1 exhibited about 15% improved GPC, compared with Comparative Example 1.

Referring to FIG. 2, the metal oxide thin film of Example 1 exhibited improved crystallinity, compared with the metal oxide thin film of Comparative Example 1 at the same deposition temperature, and referring to FIG. 3, both Example 1 and Comparative Example 1 exhibited an oxidation state of a $Zr^{4+}$ state.

2. Composition Analysis of $ZrO_2$ Thin Film

Figure 4:
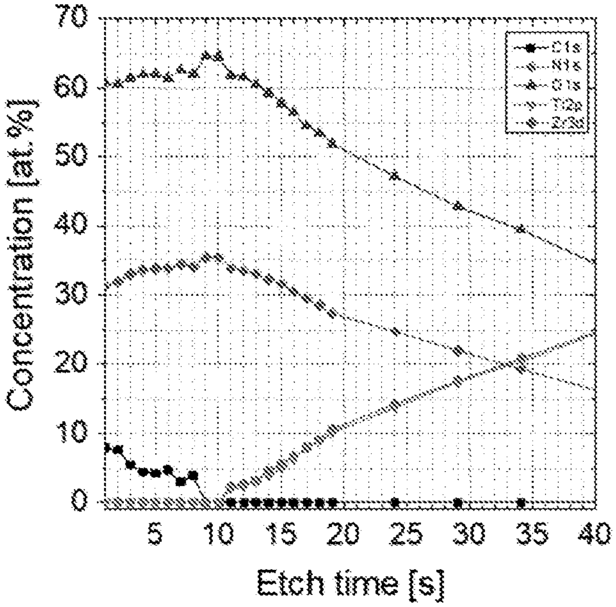
FIG. 4 is a graph showing a composition of the metal oxide thin film ($ZrO_2$) formed by using the metal oxide thin film precursor according to Comparative Example 1.
Figure 5:
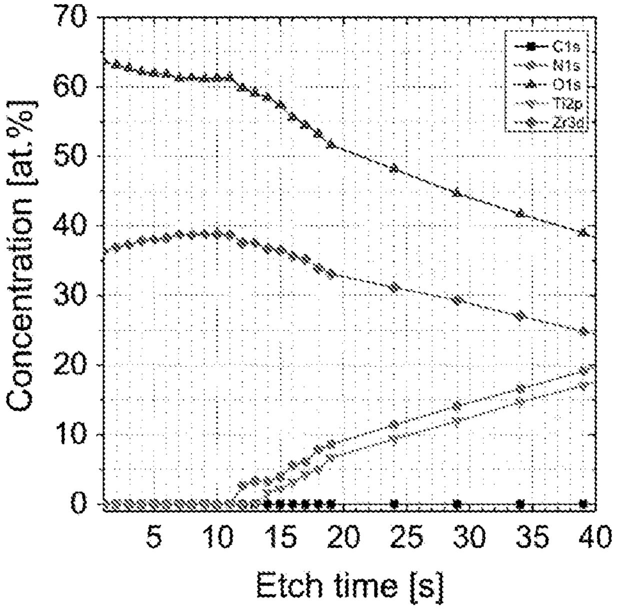
FIG. 5 is a graph showing a composition of the metal oxide thin film ($ZrO_2$) formed by using the metal oxide thin film precursor according to Example 1.
Figure 6:
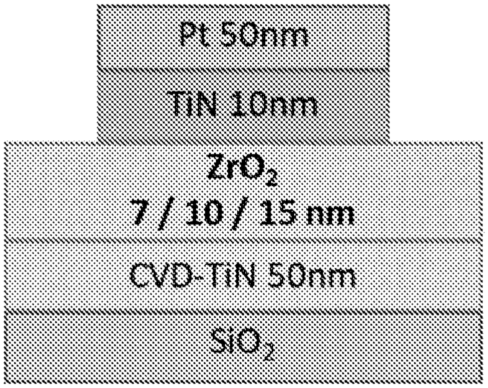
FIG. 6 is a schematic view showing a DRAM capacitor structure composed of a MIM (Metal-Insulator-Metal) structure.

A composition analysis of the metal oxide thin films ($ZrO_2$) by respectively using the metal oxide thin film precursors according to Example 1 and Comparative Example 1 (Chemical Formulas 1-1 and C-1) was performed, and the results are shown in FIGS. 4 and 5 and Table 1.

TABLE 1

| Conc. [at. %] | O | Zr | O/Zr | C |
|---|---|---|---|---|
| Comparative Example 1 | 61.9 | 33.8 | 1.83 | 4.3 |
| Example 1 | 62.0 | 38.0 | 1.63 | 0 |

Referring to FIGS. 4 and 5 and the Table 1, Comparative Example 1 exhibited very high residual C in the metal oxide thin film, and also stoichiometry of O/Zr=1.83, in which the film was deposited with oxygen being somewhat deficient. On the other hand, Example 1, in which residual C and N were not detected, compared with Comparative Example 1, was effectively suppressed from thermal decomposition at the deposition temperature (300° C.) due to an increase in thermal stability.

3. Dielectric Constant and Leakage Current in $ZrO_2$ Thin Film

Figure 7:
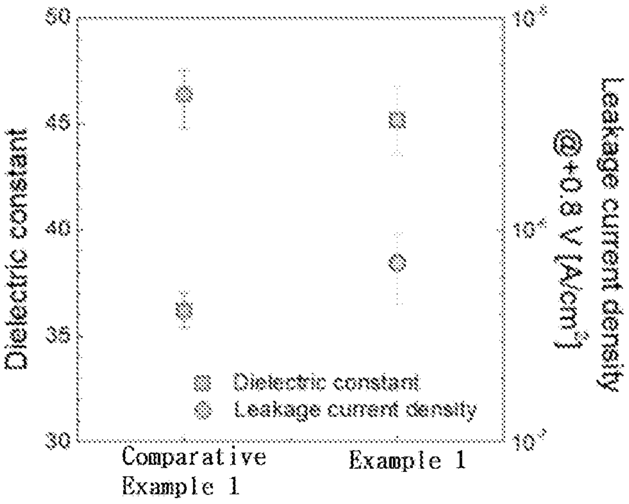
FIG. 7 is a graph showing dielectric constants and leakage current density of the metal oxide thin films ($ZrO_2$) formed by respectively using the metal oxide thin film precursors according to Example 1 and Comparative Example 1.

The metal oxide thin film precursors (Chemical Formula 1-1 and Chemical Formula C-1) according to Example 1 and Comparative Example 1 were respectively used to form each metal oxide thin film ($ZrO_2$), and then a dielectric constant and leakage current density thereof were measured, and the results are shown in FIG. 7 and Table 2.

TABLE 2

| | Dielectric const. | Leakage current density @+0.8 V [A/cm$^2$] |
|---|---|---|
| Comparative Example 1 | 36.2 | $4.33 \times 10^{-6}$ |
| Example 1 | 45.2 | $7.00 \times 10^{-7}$ |

Referring to FIG. 7 and the Table 2, Example 1 exhibited a dielectric constant of 45.2, which was improved from 36.2 of that of Comparative Example 1. In other words, the dielectric constant was improved due to crystallinity improvement. In addition, Example 1 exhibited leakage current characteristics of $7.00\times10^{-7}$ A/cm$^2$, which was improved from $4.33\times10^{-6}$ A/cm$^2$ of that of Comparative Example 1. In other words, the leakage current characteristics were improved due to a decrease in impurities such as C and the like through improvement of thermal stability. As a result, when Example 1 was used to deposit a $ZrO_2$ thin film in an atomic layer deposition (ALD) method, the deposited $ZrO_2$ thin film exhibited improved electrical characteristics, from which performance improvement of a DRAM capacitor may be easily inferred.

4. Temperature-dependent Crystallinity of $HfO_2$ Thin Films

Figure 8:
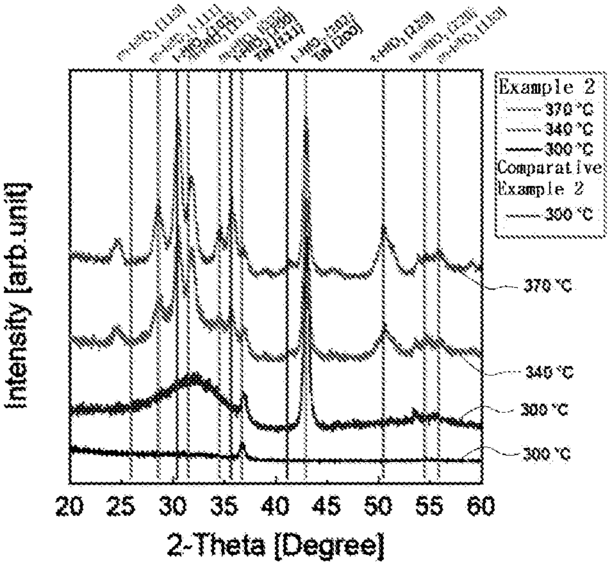
FIG. 8 is a graph showing crystallinity of the metal oxide thin films ($ZrO_2$) formed by respectively using the metal oxide thin film precursors according to Example 1 and Comparative Example 1.

The metal oxide thin films ($HfO_2$) formed by respectively using the metal oxide thin film precursors (Chemical Formula 1-2 and Chemical Formula C-2) according to Example 2 and Comparative Example 2 were evaluated with respect to crystallinity according to a temperature, and the results are shown in FIG. 8.

Referring to FIG. 8, Example 2 and Comparative Example 2 exhibited no specific crystallinity at 300° C., but Example 2, in which the deposition could be performed to 340° C. and 370° C., exhibited crystallization even in a state of as-dep., when the deposition temperature was increased. Particularly, the crystallization was confirmed as a tetragonal phase with a large dielectric constant among $HfO_2$ crystalline phases.

5. Electrical Properties of $HfO_2$ Thin Film

Figure 9:
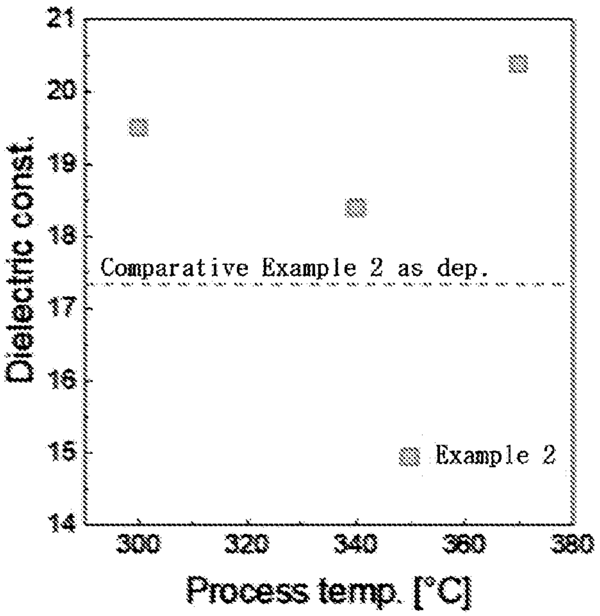
FIG. 9 is a graph showing dielectric constant changes of metal oxide thin films ($HfO_2$) formed by respectively using the metal oxide thin film precursors according to Example 2 and Comparative Example 2.
Figure 10:
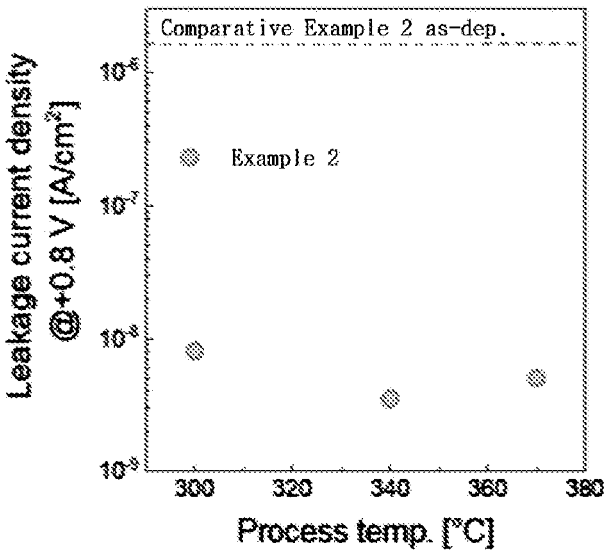
FIG. 10 is a graph showing leakage current density changes according to process temperatures of the metal oxide thin films ($HfO_2$) formed by respectively using the metal oxide thin film precursors according to Example 2 and Comparative Example 2.
Figure 11:
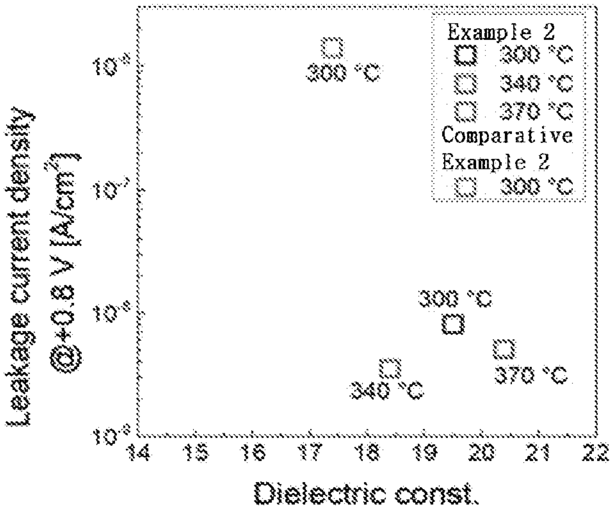
FIG. 11 is a graph showing leakage current density changes according to dielectric constants of the metal oxide thin films ($HfO_2$) formed by respectively using the metal oxide thin film precursors according to Example 2 and Comparative Example 2.

The metal oxide thin film precursors according to Example 2 and Comparative Example 2 (Chemical Formula 1-2 and Chemical Formula C-2) were respectively used to form metal oxide thin films ($HfO_2$), and then electrical characteristics of the metal oxide thin films ($HfO_2$) were evaluated, and the results are shown in FIGS. 9 to 11 and Table 3.

TABLE 3

| | Dielectric constant | Leakage current@+0.8 V [A/cm$^2$] |
|---|---|---|
| Example 2 300° C. | 19.5 | $8.06 \times 10^{-9}$ |
| Example 2 340° C. | 18.4 | $3.52 \times 10^{-9}$ |
| Example 2 370° C. | 20.4 | $5.03 \times 10^{-9}$ |
| Comparative Example 2 300° C. | 17.4 | $1.40 \times 10^{-6}$ |

Referring to FIGS. 9 to 11 and Table 3, Example 2, compared with Comparative Example 2, exhibited an improved dielectric constant according to crystallinity improvement Particularly, Example 2 exhibited a significantly improved leakage current of about a 2-order or more. When Example 2 was used to deposit a $HfO_2$ thin film in ALD, the deposited $HfO_2$ thin film exhibited improved electrical characteristics, from which performance of a DRAM capacitor may be easily inferred.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims. Therefore, the aforementioned embodiments should be understood to be examples but not limiting the present invention in any way.

What is claimed is:

1. A sample of a metal oxide thin film precursor represented by Chemical Formula 1:

[Chemical Formula 1]

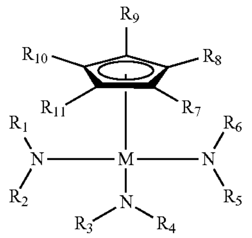

wherein, in Chemical Formula 1,

M is zirconium (Zr) or hafnium (Hf), $R^1$ to $R^6$ are each independently hydrogen, deuterium, a substituted or unsubstituted C1 to C6 alkyl group, a substituted or unsubstituted C2 to C6 alkenyl group, or a substituted or unsubstituted silyl group, $R^7$ to $R^{11}$ are each independently hydrogen, deuterium, a halogen element, a substituted or unsubstituted C1 to C6 alkyl group, a substituted or unsubstituted C2 to C6 alkenyl group, a substituted or unsubstituted C1 to C6 heteroalkyl group, or a substituted or unsubstituted silyl group, provided that at least one of $R^7$ to $R^{11}$ is necessarily deuterium or at least one of $R^1$ to $R^6$ is necessarily deuterium, at least one of $R^1$ to $R^6$ are optionally linked with at least one of $R^7$ to $R^{11}$ to form a fused ring, $R^1$ and $R^2$ are optionally linked with each other to form a fused ring, $R^3$ and $R^4$ are optionally linked with each other to form a fused ring, $R^5$ and $R^6$ are optionally linked with each other to form a fused ring, at least one of $R^1$ and $R^2$ and at least one of $R^3$ and $R^4$ are optionally linked with each other to form a fused ring, at least one of $R^3$ and $R^4$ and at least one of $R^5$ and $R^6$ are optionally linked with each other to form a fused ring, and at least one of $R^1$ and $R^2$ and at least one of $R^5$ and $R^6$ are optionally linked with each other to form a fused ring.

2. The metal oxide thin film precursor of claim 1, wherein $R^1$ to $R^6$ are each independently a substituted or unsubstituted C1 to C6 alkyl group.

3. The metal oxide thin film precursor of claim 1, wherein at least two of $R^7$ to $R^{11}$ are necessarily deuterium.

4. The metal oxide thin film precursor of claim 1, wherein at least three of $R^7$ to $R^{11}$ are necessarily deuterium.

5. The metal oxide thin film precursor of claim 1, wherein at least four of $R^7$ to $R^{11}$ are necessarily deuterium.

6. The metal oxide thin film precursor of claim 1, wherein all of $R^7$ to $R^{11}$ are deuterium.

7. The metal oxide thin film precursor of claim 1, wherein at least one of $R^1$ to $R^6$ is a C1 to C6 alkyl group substituted with deuterium.

8. The metal oxide thin film precursor of claim 1, wherein $R^6$ and $R^8$ are linked with each other to form a fused ring.

9. The metal oxide thin film precursor of claim 8, wherein $R^3$ and $R^4$ are linked with each other to form a fused ring.

10. The metal oxide thin film precursor of claim 8, wherein $R^4$ and $R^5$ are linked with each other to form a fused ring.

11. The metal oxide thin film precursor of claim 1, wherein

Chemical Formula 1 is represented by Chemical Formula 2-1 or Chemical Formula 2-2:

[Chemical Formula 2-1]

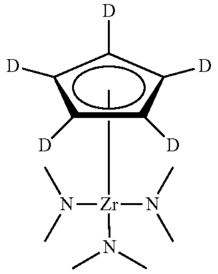

[Chemical Formula 2-2]

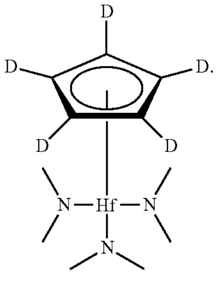

12. The metal oxide thin film precursor of claim 1, wherein

Chemical Formula 1 is represented by any one of Chemical Formula 3-1 to Chemical Formula 3-18:

[Chemical Formula 3-1]

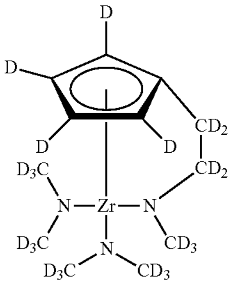

[Chemical Formula 3-2]

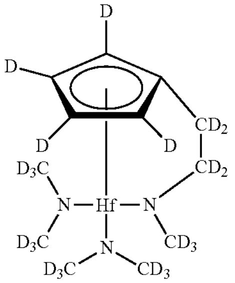

[Chemical Formula 3-3]

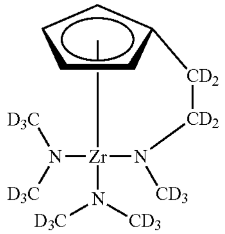

[Chemical Formula 3-4]

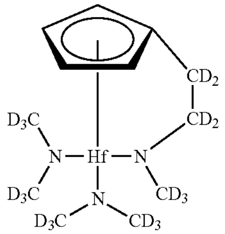

[Chemical Formula 3-5]

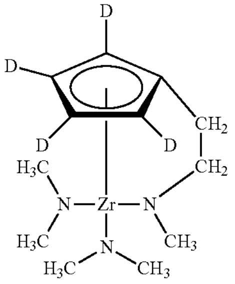

[Chemical Formula 3-6]

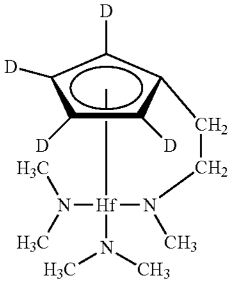

-continued
[Chemical Formula 3-7]
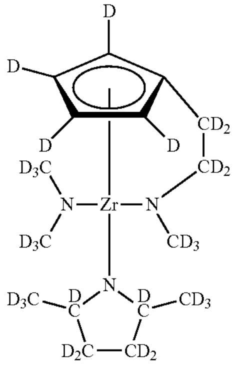
[Chemical Formula 3-8]
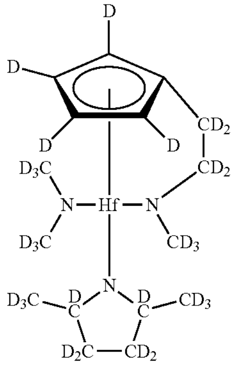
[Chemical Formula 3-9]
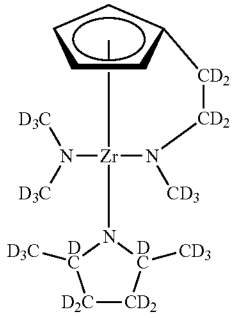
[Chemical Formula 3-10]
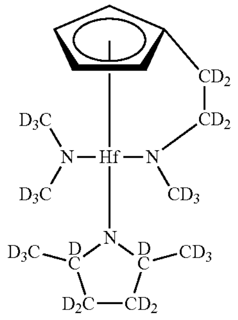
-continued
[Chemical Formula 3-11]
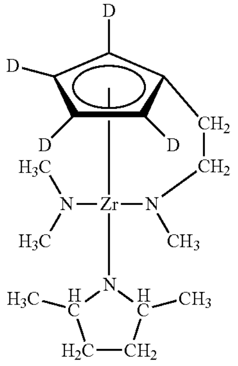
[Chemical Formula 3-12]
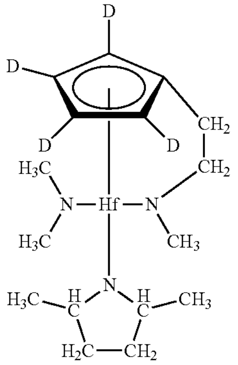
[Chemical Formula 3-13]
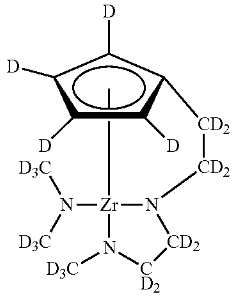
[Chemical Formula 3-14]
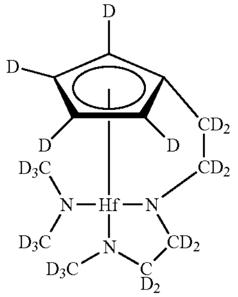
[Chemical Formula 3-15]
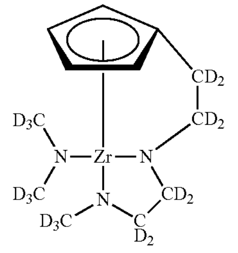

-continued
[Chemical Formula 3-16]
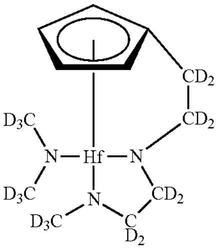
[Chemical Formula 3-17]
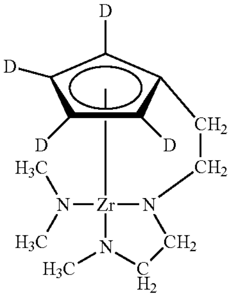
[Chemical Formula 3-18]
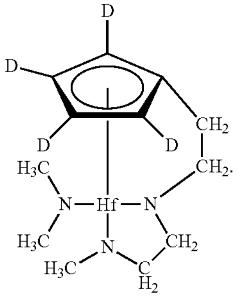
13. The metal oxide thin film precursor of claim 1, wherein
Chemical Formula 1 is represented by any one of Chemical Formula 4-1 to Chemical Formula 4-24:
[Chemical Formula 4-1]
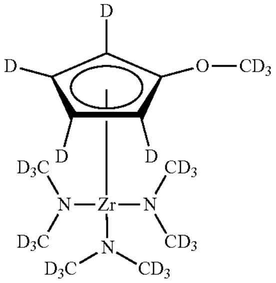
[Chemical Formula 4-2]
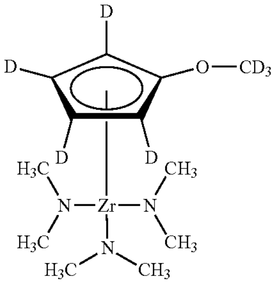
-continued
[Chemical Formula 4-3]
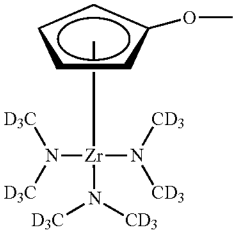
[Chemical Formula 4-4]
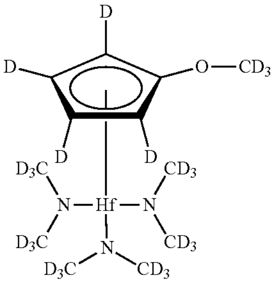
[Chemical Formula 4-5]
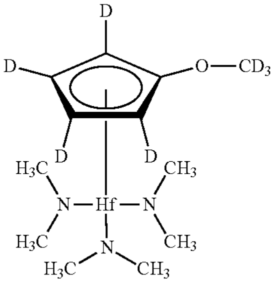
[Chemical Formula 4-6]
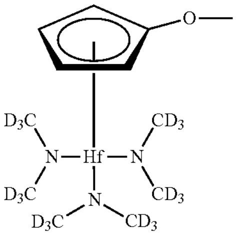
[Chemical Formula 4-7]
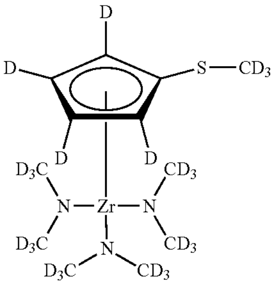

-continued
[Chemical Formula 4-8]
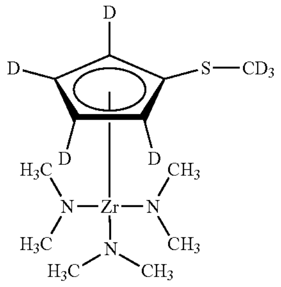
[Chemical Formula 4-9]
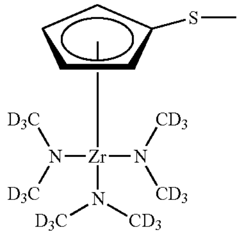
[Chemical Formula 4-10]
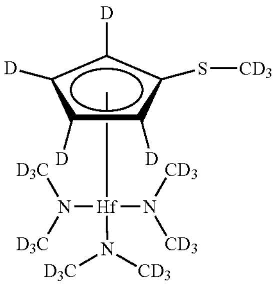
[Chemical Formula 4-11]
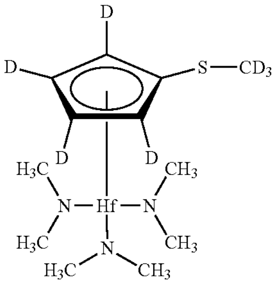
[Chemical Formula 4-12]
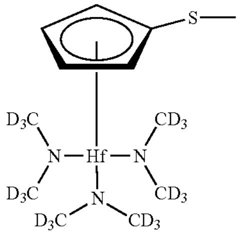
-continued
[Chemical Formula 4-13]
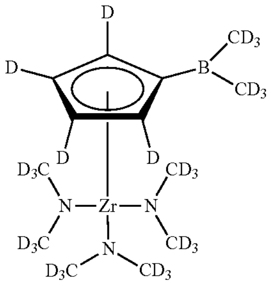
[Chemical Formula 4-14]
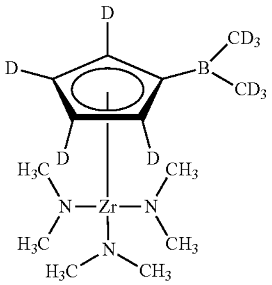
[Chemical Formula 4-15]
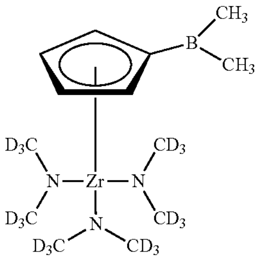
[Chemical Formula 4-16]
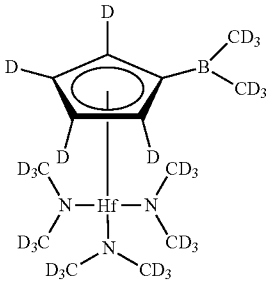
[Chemical Formula 4-17]
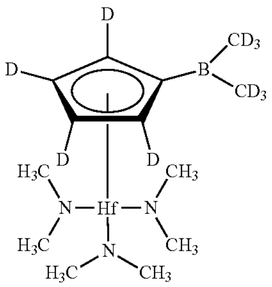

-continued
[Chemical Formula 4-18]
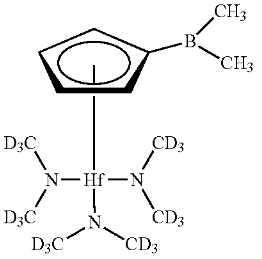
[Chemical Formula 4-19]
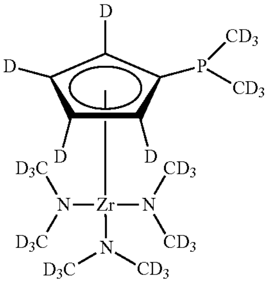
[Chemical Formula 4-20]
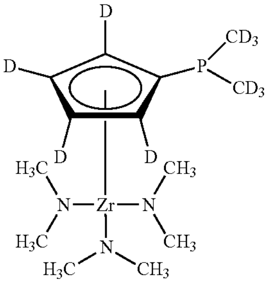
[Chemical Formula 4-21]
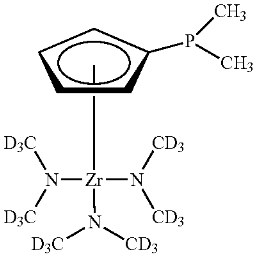
[Chemical Formula 4-22]
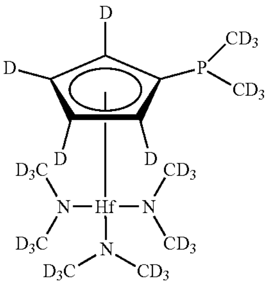
-continued
[Chemical Formula 4-23]
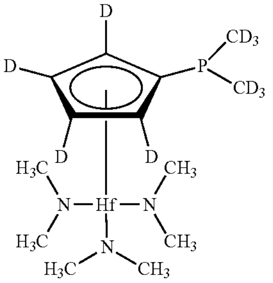
[Chemical Formula 4-24]
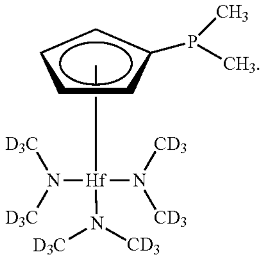
14. The metal oxide thin film precursor of claim 1, wherein
Chemical Formula 1 is represented by any one of Chemical Formula 5-1 to Chemical Formula 5-15:
[Chemical Formula 5-1]
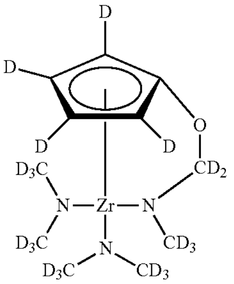
[Chemical Formula 5-2]
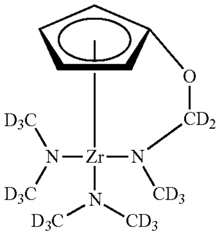
[Chemical Formula 5-3]
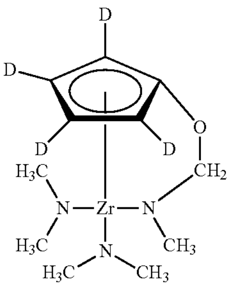

-continued
[Chemical Formula 5-4]
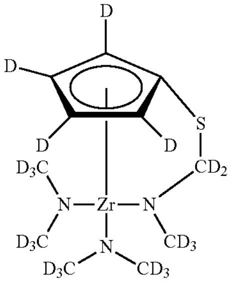
[Chemical Formula 5-5]
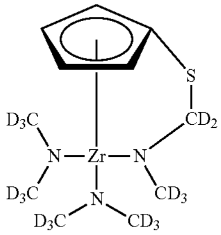
[Chemical Formula 5-6]
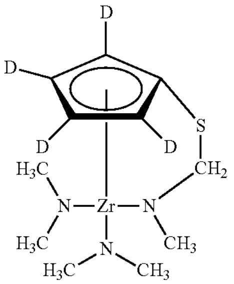
[Chemical Formula 5-7]
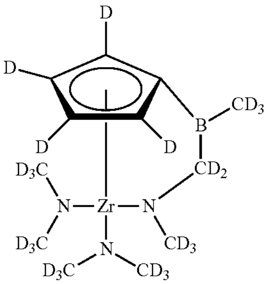
[Chemical Formula 5-8]
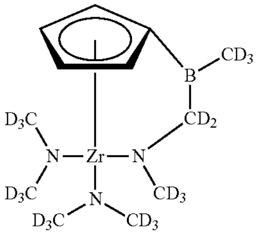
[Chemical Formula 5-9]
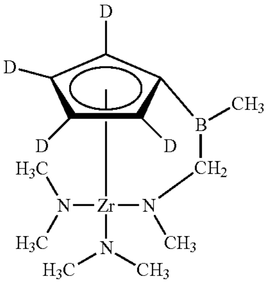
-continued
[Chemical Formula 5-10]
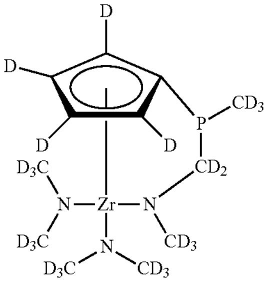
[Chemical Formula 5-11]
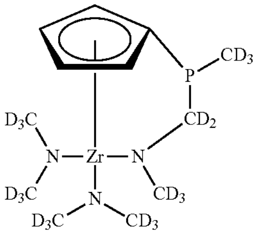
[Chemical Formula 5-12]
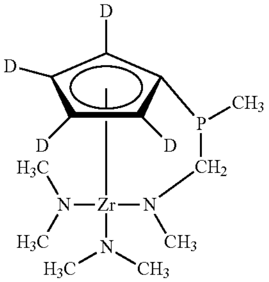
[Chemical Formula 5-13]
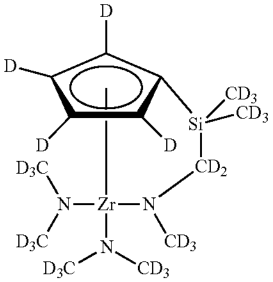
[Chemical Formula 5-14]
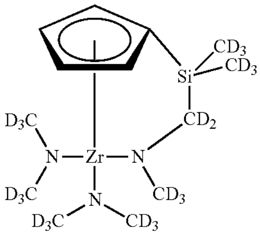

-continued
[Chemical Formula 5-15]
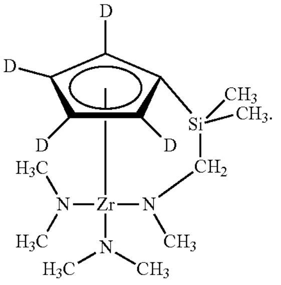
15. The metal oxide thin film precursor of claim 1, wherein
Chemical Formula 1 is represented by any one of Chemical Formula 6-1 to Chemical Formula 6-15:
[Chemical Formula 6-1]
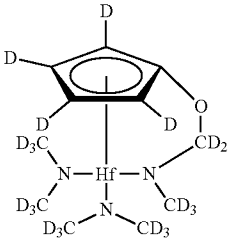
[Chemical Formula 6-2]
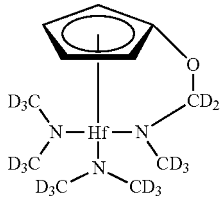
[Chemical Formula 6-3]
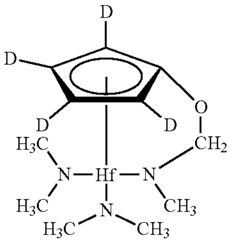
[Chemical Formula 6-4]
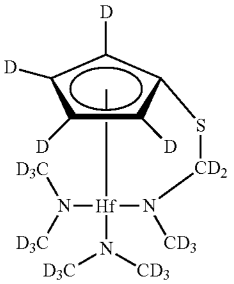
-continued
[Chemical Formula 6-5]
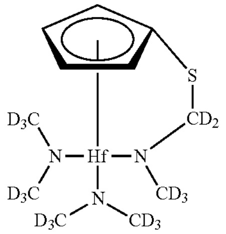
[Chemical Formula 6-6]
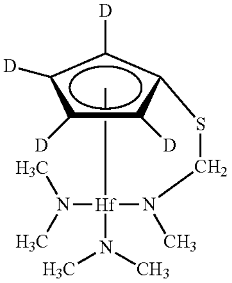
[Chemical Formula 6-7]
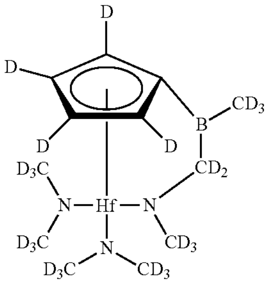
[Chemical Formula 6-8]
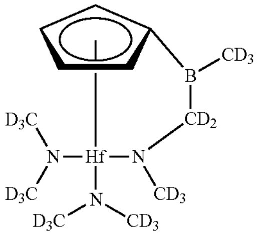
[Chemical Formula 6-9]
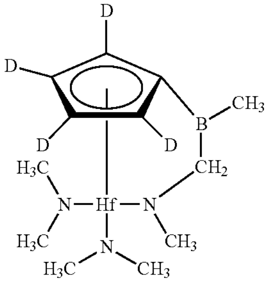
[Chemical Formula 6-10]
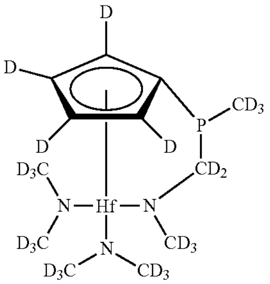

-continued
[Chemical Formula 6-11]
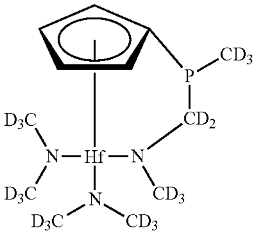
[Chemical Formula 6-12]
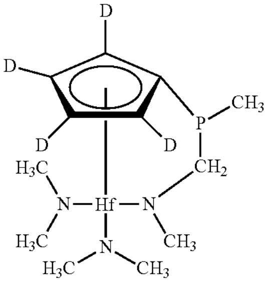
[Chemical Formula 6-13]
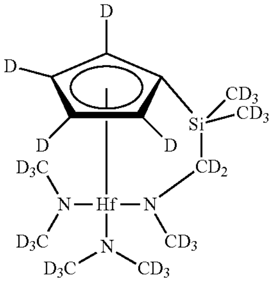
[Chemical Formula 6-14]
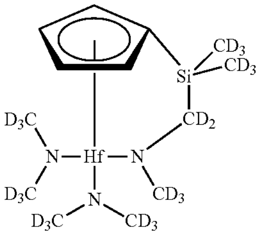
[Chemical Formula 6-15]
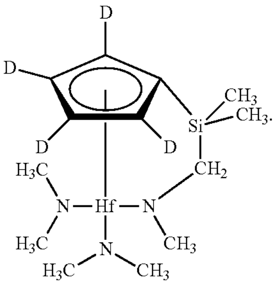
16. The metal oxide thin film precursor of claim 1, wherein
Chemical Formula 1 is represented by any one of Chemical Formula 7-1 to Chemical Formula 7-15:
[Chemical Formula 7-1]
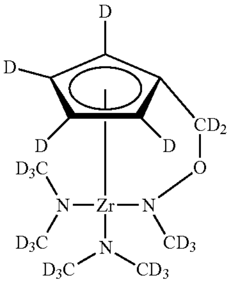
[Chemical Formula 7-2]
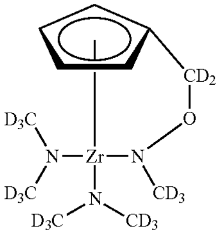
[Chemical Formula 7-3]
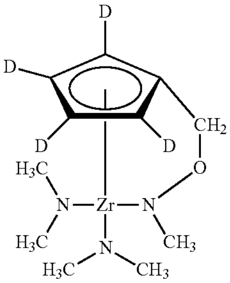
[Chemical Formula 7-4]
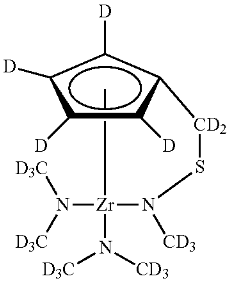
[Chemical Formula 7-5]
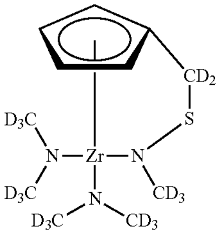

-continued
[Chemical Formula 7-6]
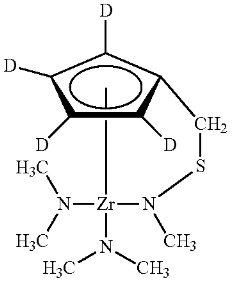
[Chemical Formula 7-7]
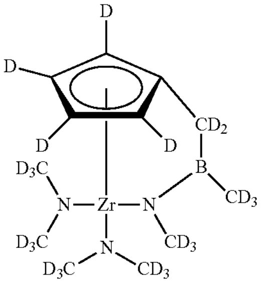
[Chemical Formula 7-8]
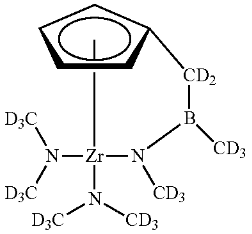
[Chemical Formula 7-9]
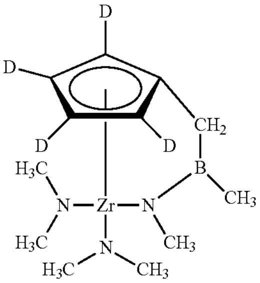
[Chemical Formula 7-10]
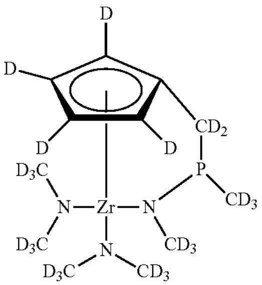
-continued
[Chemical Formula 7-11]
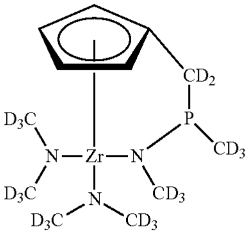
[Chemical Formula 7-12]
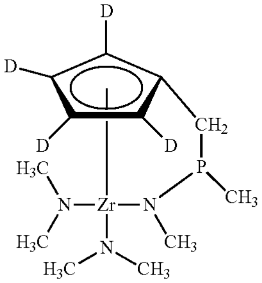
[Chemical Formula 7-13]
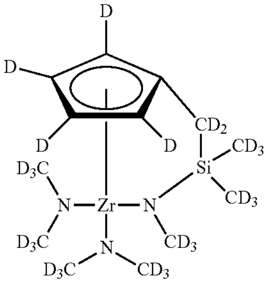
[Chemical Formula 7-14]
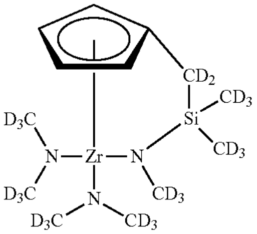
[Chemical Formula 7-15]
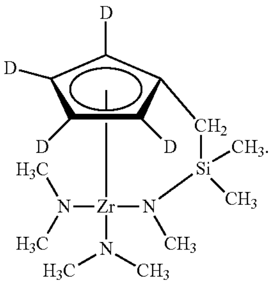
17. The metal oxide thin film precursor of claim 1, wherein
Chemical Formula 1 is represented by any one of Chemical Formula 8-1 to Chemical Formula 8-15:

[Chemical Formula 8-1]
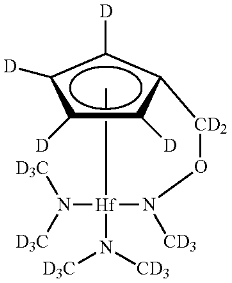
[Chemical Formula 8-2]
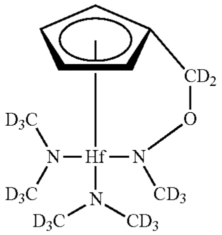
[Chemical Formula 8-3]
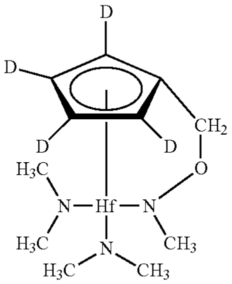
[Chemical Formula 8-4]
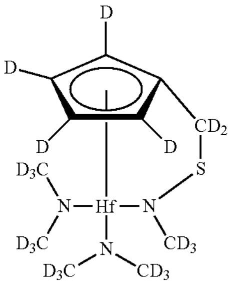
[Chemical Formula 8-5]
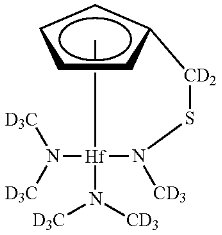
[Chemical Formula 8-6]
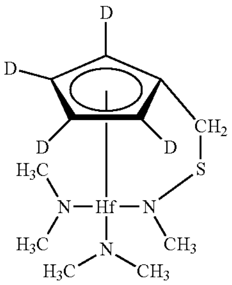
-continued
[Chemical Formula 8-7]
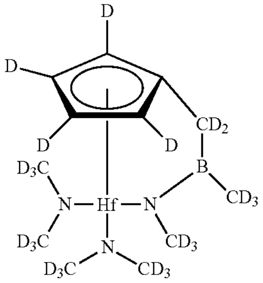
[Chemical Formula 8-8]
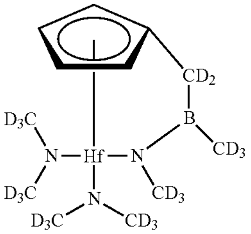
[Chemical Formula 8-9]
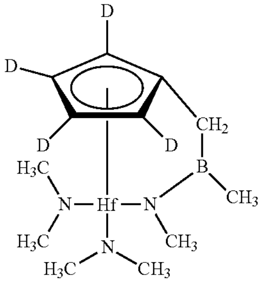
[Chemical Formula 8-10]
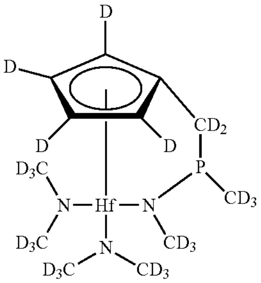
[Chemical Formula 8-11]
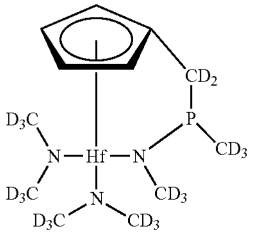

-continued
[Chemical Formula 8-12]
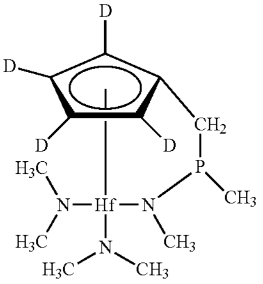
[Chemical Formula 8-13]
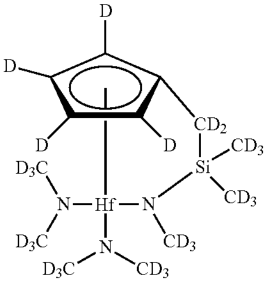
[Chemical Formula 8-14]
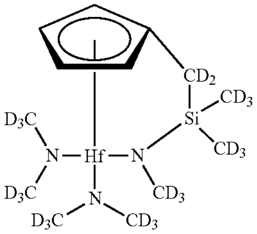
[Chemical Formula 8-15]
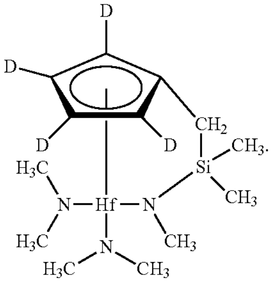
18. The metal oxide thin film precursor of claim 1, wherein
Chemical Formula 1 is represented by any one of Chemical Formula 9-1 to Chemical Formula 9-18:
[Chemical Formula 9-1]
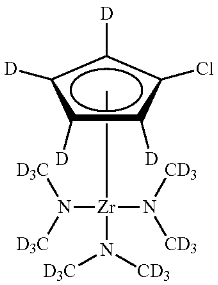
-continued
[Chemical Formula 9-2]
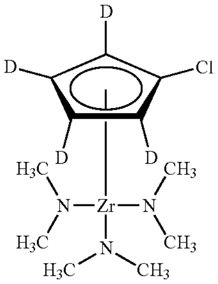
[Chemical Formula 9-3]
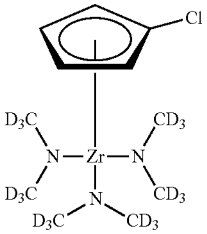
[Chemical Formula 9-4]
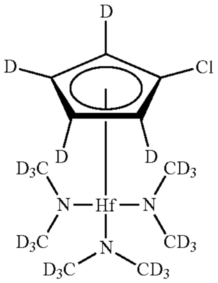
[Chemical Formula 9-5]
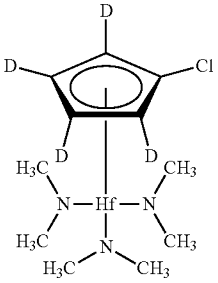
[Chemical Formula 9-6]
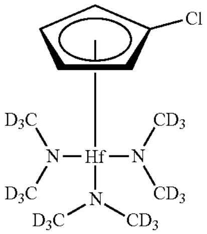

-continued
[Chemical Formula 9-7]
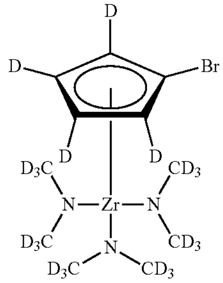
[Chemical Formula 9-8]
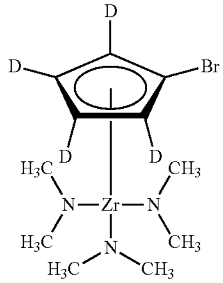
[Chemical Formula 9-9]
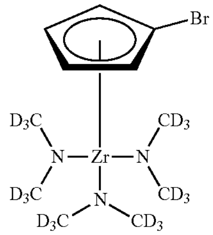
[Chemical Formula 9-10]
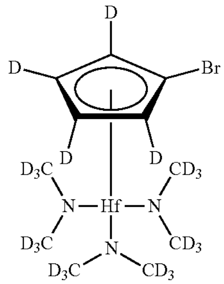
[Chemical Formula 9-11]
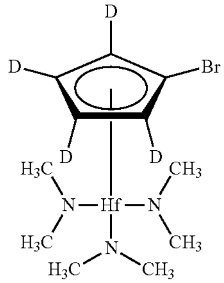
[Chemical Formula 9-12]
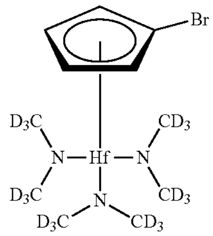
-continued
[Chemical Formula 9-13]
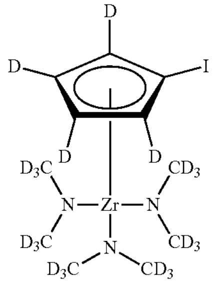
[Chemical Formula 9-14]
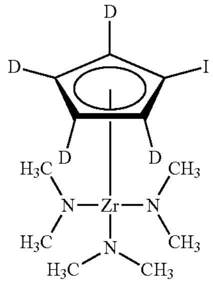
[Chemical Formula 9-15]
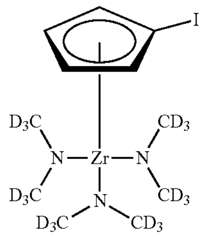
[Chemical Formula 9-16]
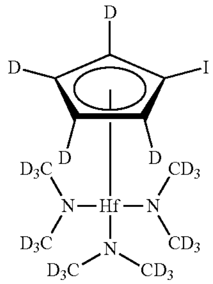
[Chemical Formula 9-17]
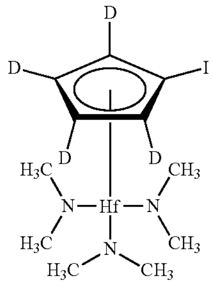

-continued

[Chemical Formula 9-18]

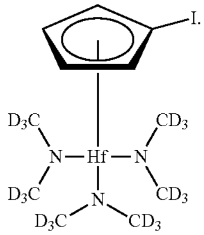

19. A method of fabricating a metal oxide thin film, comprising:

a first process of supplying the metal oxide thin film precursor of claim 1 to a substrate to adsorb the metal oxide thin film precursor on a surface of the substrate;

a second process of supplying at least one of an oxygen-containing gas, a nitrogen-containing gas, and a plasma to react with the metal oxide thin film precursor to form a metal oxide thin film on the substrate; and sequentially repeating the first and second processes.

20. The method of claim 19, wherein the oxygen-containing gas includes aqueous vapor ($H_2O$), oxygen ($O_2$), ozone ($O_3$), hydrogen peroxide ($H_2O_2$), nitrous oxide ($N_2O$), or a combination thereof.

21. The method of claim 19, wherein the nitrogen-containing gas includes nitrogen ($N_2$), ammonia ($NH_3$), hydrazine ($N_2H_4$), nitrous oxide ($N_2O$), or a combination thereof.

22. The method of claim 19, wherein the method includes an atomic layer deposition (ALD) method or a metal organic chemical vapor deposition (MOCVD) method.

* * * * *